(12) United States Patent
Nakamura et al.

(10) Patent No.: US 12,262,623 B2
(45) Date of Patent: Mar. 25, 2025

(54) MANUFACTURING METHOD OF DISPLAY DEVICE

(71) Applicant: Semiconductor Energy Laboratory Co., Ltd., Atsugi (JP)

(72) Inventors: Daiki Nakamura, Atsugi (JP); Tomoya Aoyama, Atsugi (JP); Kensuke Yoshizumi, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 276 days.

(21) Appl. No.: 17/842,979

(22) Filed: Jun. 17, 2022

(65) Prior Publication Data

US 2023/0006140 A1     Jan. 5, 2023

(30) Foreign Application Priority Data

Jun. 30, 2021    (JP) ................. 2021-108371

(51) Int. Cl.
     *H10K 71/20*      (2023.01)
     *H10K 50/11*      (2023.01)
     (Continued)

(52) U.S. Cl.
     CPC ........... *H10K 71/233* (2023.02); *H10K 50/11* (2023.02); *H10K 50/813* (2023.02);
     (Continued)

(58) Field of Classification Search
     None
     See application file for complete search history.

(56) References Cited

U.S. PATENT DOCUMENTS 5,953,985 A    9/1999   Kobayashi
6,120,338 A    9/2000   Hirano et al.
(Continued)

FOREIGN PATENT DOCUMENTS

CN      102244202 A    *   11/2011     ......... B60H 1/00371
JP      2000-036385 A      2/2000
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Michael Lebentritt
(74) *Attorney, Agent, or Firm* — Eric J. Robinson; Robinson Intellectual Property Law Office, P.C.

(57) ABSTRACT

A display device that can easily have high resolution is provided. A display device having both high display quality and high resolution is provided. A display device with high contrast is provided. A first EL film is deposited in contact with a top surface and a side surface of each of a first pixel electrode and a second pixel electrode each having a tapered shape. A first sacrificial film is formed to cover the first EL film. The first sacrificial film and the first EL film are etched to expose the second pixel electrode and form a first EL layer over the first pixel electrode and a first sacrificial layer over the first EL layer, and then, the first sacrificial layer is removed. The first EL film and the second EL film are etched by dry etching. The first sacrificial layer is removed by wet etching.

10 Claims, 22 Drawing Sheets

(51) Int. Cl.
*H10K 50/813* (2023.01)
*H10K 50/844* (2023.01)
*H10K 59/12* (2023.01)
*H10K 71/00* (2023.01)
*H10K 71/40* (2023.01)
*H10K 71/60* (2023.01)

(52) U.S. Cl.
CPC ........... *H10K 50/844* (2023.02); *H10K 59/12* (2023.02); *H10K 71/00* (2023.02); *H10K 71/40* (2023.02); *H10K 71/60* (2023.02); *H10K 59/1201* (2023.02)

(56) References Cited

U.S. PATENT DOCUMENTS

| | | | |
|---|---|---|---|
| 7,183,146 | B2 * | 2/2007 | Yamazaki ........... H01L 27/1255 438/164 |
| 7,399,991 | B2 | 7/2008 | Seo et al. |
| 10,096,776 | B2 | 10/2018 | Malinowski et al. |
| 10,862,036 | B2 | 12/2020 | Ke et al. |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2018/0196313 | A1 * | 7/2018 | Kang ................. G02F 1/133514 |
| 2020/0203662 | A1 | 6/2020 | Mollard et al. |
| 2022/0238836 | A1 * | 7/2022 | Okazaki ............... H10K 50/822 |
| 2022/0320184 | A1 * | 10/2022 | Okazaki ............... H10K 59/124 |

FOREIGN PATENT DOCUMENTS

| | | | | |
|---|---|---|---|---|
| JP | 2002-324673 | A | | 11/2002 |
| JP | 2003-059663 | A | | 2/2003 |
| JP | 2004185838 | A | * | 7/2004 |
| JP | 2008-098106 | A | | 4/2008 |
| JP | 2008-147072 | A | | 6/2008 |
| JP | 2008-251270 | A | | 10/2008 |
| JP | 2014-120218 | A | | 6/2014 |
| JP | 2014-135251 | A | | 7/2014 |
| JP | 2014-232568 | A | | 12/2014 |
| JP | 2015-115178 | A | | 6/2015 |
| JP | 2016-197494 | A | | 11/2016 |
| JP | 2016-535413 | | | 11/2016 |
| JP | 2018-521459 | | | 8/2018 |
| JP | 2019-179696 | A | | 10/2019 |
| JP | 2020-160305 | A | | 10/2020 |
| WO | WO-2022153145 | A1 | * | 7/2021 ......... H10K 59/1201 |
| WO | WO-2022/130117 | | | 6/2022 |
| WO | WO-2022/144668 | | | 7/2022 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

* cited by examiner

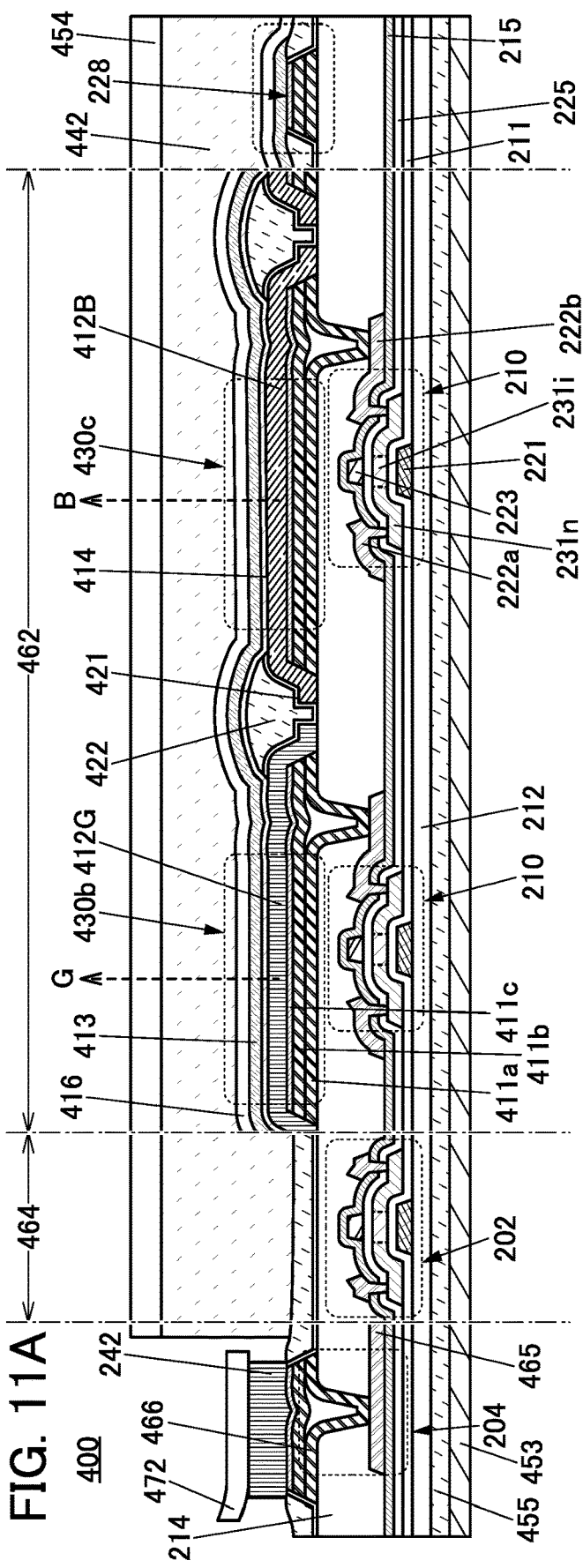

MANUFACTURING METHOD OF DISPLAY DEVICE

BACKGROUND OF THE INVENTION

1. Field of the Invention

One embodiment of the present invention relates to a display device. One embodiment of the present invention relates to a manufacturing method of a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

2. Description of the Related Art

In recent years, higher resolution has been required for display panels. Examples of devices that require high-resolution display panels include a smartphone, a tablet terminal, and a laptop computer. Furthermore, higher resolution has been required for a stationary display device such as a television device or a monitor device along with an increase in definition. A device absolutely required to have a high-resolution display panel is a device for virtual reality (VR) or augmented reality (AR).

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

An organic EL element generally has a structure in which, for example, a layer containing a light-emitting organic compound is provided between a pair of electrodes. By voltage application to this element, the light-emitting organic compound can emit light. A display device including such an organic EL element needs no backlight which is necessary for a liquid crystal display device and the like and thus can have advantages such as thinness, lightweight, high contrast, and low power consumption. Patent Document 1, for example, discloses an example of a display device using an organic EL element.

Organic EL elements are sometimes used in display portions of display devices for AR or VR. Non-Patent Document 1 discloses a manufacturing method of an organic optoelectronic device using standard UV photolithography.

REFERENCE

Patent Document

[Patent Document 1] Japanese Published Patent Application No. 2002-324673

Non-Patent Document

[Non-Patent Document 1] B. Lamprecht et al., "Organic optoelectronic device fabrication using standard UV photolithography" phys. stat. sol. (RRL) 2, No. 1, p. 16-18 (2008)

SUMMARY OF THE INVENTION

An object of one embodiment of the present invention is to provide a method for easily manufacturing a high-resolution display device. An object of one embodiment of the present invention is to provide a display device having both high display quality and high resolution. An object of one embodiment of the present invention is to provide a display device with high contrast. An object of one embodiment of the present invention is to provide a highly reliable display device.

An object of one embodiment of the present invention is to provide a display device with a novel structure or a method for manufacturing the display device. An object of one embodiment of the present invention is to provide a method for manufacturing the above display device with high yield. An object of one embodiment of the present invention is to reduce at least one of problems of the conventional technique.

Note that the description of these objects does not preclude the existence of other objects. In one embodiment of the present invention, there is no need to achieve all the objects. Objects other than these can be derived from the description of the specification, the drawings, the claims, and the like.

One embodiment of the present invention is a manufacturing method of a display device, which includes a first step of forming a first pixel electrode and a second pixel electrode so that they each have a tapered shape; a second step of depositing a first EL film in contact with a top surface and a side surface of each of the first pixel electrode and the second pixel electrode; a third step of forming a first sacrificial film to cover the first EL film; a fourth step of processing the first sacrificial film and the first EL film to expose the second pixel electrode and form a first EL layer over the first pixel electrode and a first sacrificial layer over the first EL layer; a fifth step of depositing a second EL film over the first sacrificial layer and the second pixel electrode; a sixth step of forming a second sacrificial film to cover the second EL film; a seventh step of processing the second sacrificial film and the second EL film to expose the first sacrificial layer and form a second EL layer over the second pixel electrode and a second sacrificial layer over the second EL layer; an eighth step of removing the first sacrificial layer and the second sacrificial layer; and a ninth step of drying the first EL layer and the second EL layer. In the fourth step, the first EL film and the first sacrificial film are processed by dry etching. In the seventh step, the second EL film and the second sacrificial film are processed by dry etching. In the eighth step, the first sacrificial layer and the second sacrificial layer are removed by wet etching.

In the above, the first sacrificial film preferably contains a resin material soluble in water or alcohol. In the fourth step, the first sacrificial film and the first EL film are preferably processed in succession by dry etching in an atmosphere containing oxygen. In the eighth step, the first sacrificial layer and the second sacrificial layer are preferably dissolved in water or alcohol to be removed.

In any of the above, the first EL layer and the second EL layer are preferably processed to each have an island-like top surface shape.

In any of the above, a tenth step of forming a common electrode over the first EL layer and the second EL layer is preferably provided after the ninth step. An eleventh step of forming a protective layer over the common electrode is preferably provided.

In the above, a twelfth step of forming a common layer over the first EL layer and the second EL layer is preferably provided between the ninth step and the tenth step.

Another embodiment of the present invention is a manufacturing method of a display device, which includes a first step of forming a first pixel electrode and a second pixel electrode so that they each have a tapered shape; a second step of depositing an EL film in contact with a top surface and a side surface of each of the first pixel electrode and the second pixel electrode; a third step of forming a sacrificial film to cover the EL film; a fourth step of processing the sacrificial film and the EL film to form a first EL layer over the first pixel electrode, a first sacrificial layer over the first EL layer, a second EL layer over the second pixel electrode, and a second sacrificial layer over the second EL layer; a fifth step of removing the first sacrificial layer and the second sacrificial layer; and a sixth step of drying the first EL layer and the second EL layer. In the fourth step, the EL film and the sacrificial film are processed by dry etching. In the fifth step, the first sacrificial layer and the second sacrificial layer are removed by wet etching. Furthermore, the EL film includes a light-emitting layer that emits white light.

In the above, the sacrificial film preferably contains a resin material soluble in water or alcohol. In the fourth step, the sacrificial film and the EL film are preferably processed in succession by dry etching in an atmosphere containing oxygen. In the fifth step, the first sacrificial layer and the second sacrificial layer are preferably dissolved in water or alcohol to be removed.

In any of the above, the first EL layer and the second EL layer are preferably processed to each have an island-like top surface shape.

In any of the above, a seventh step of forming a common electrode over the first EL layer and the second EL layer and an eighth step of forming a protective layer over the common electrode are preferably provided after the sixth step.

In the above, a ninth step of forming a common layer over the first EL layer and the second EL layer is preferably provided between the seventh step and the eighth step.

According to one embodiment of the present invention, a method for easily manufacturing a high-resolution display device can be provided. A display device having both high display quality and high resolution can be provided. A display device with high contrast can be provided. A highly reliable display device can be provided.

According to one embodiment of the present invention, a display device with a novel structure or a method for manufacturing the display device can be provided. A method for manufacturing the above display device with high yield can be provided. According to one embodiment of the present invention, at least one of problems of the conventional technique can be reduced.

Note that the description of these effects does not preclude the existence of other effects. One embodiment of the present invention does not necessarily have all the effects. Effects other than these can be derived from the description of the specification, the drawings, the claims, and the like.

BRIEF DESCRIPTION OF THE DRAWINGS

FIGS. 11A and 11B illustrate a structure example of a display device.

DETAILED DESCRIPTION OF THE INVENTION

Figure 1A:
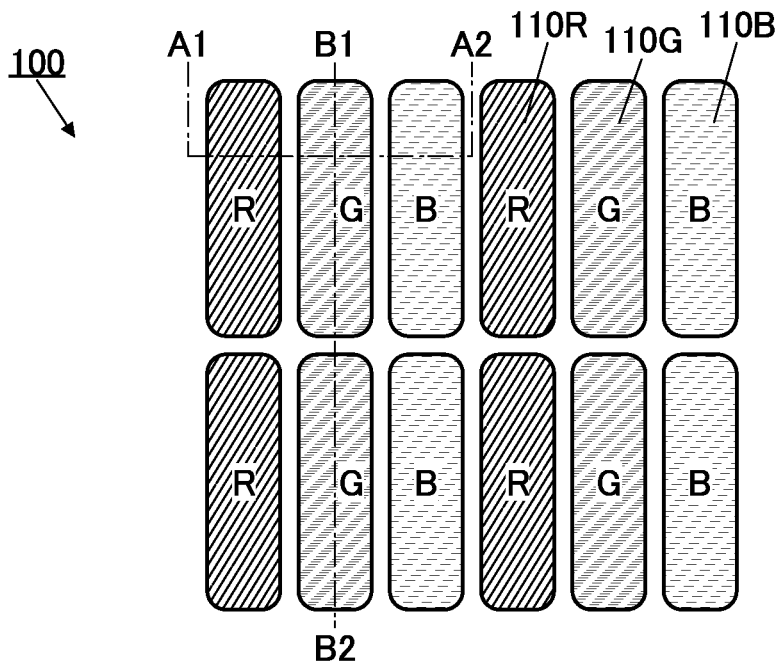
FIGS. 1A to 1C illustrate a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, the terms "film" and "layer" can be interchanged with each other in some cases. For example, in some cases, the terms "conductive layer" and "insulating layer" can be changed into "conductive film" and "insulating film", respectively.

In this specification and the like, a device formed using a metal mask or a fine metal mask (FMM) is sometimes referred to as a device having a metal mask (MM) structure.

In this specification and the like, a device formed without using a metal mask or an FMM is sometimes referred to as a device having a metal maskless (MML) structure.

Embodiment 1

In this embodiment, structure examples of a display device of one embodiment of the present invention and manufacturing method examples of the display device will be described.

One embodiment of the present invention is a display device including a light-emitting element (also referred to as a light-emitting device). The display device includes at least two light-emitting elements that emit light of different colors. The light-emitting elements each include a pair of electrodes and an EL layer therebetween. The light-emitting element is preferably an organic electroluminescent element (organic EL element). The two or more light-emitting elements emitting light of different colors include respective EL layers containing different light-emitting materials. For example, three kinds of light-emitting elements emitting red (R), green (G), and blue (B) light are included, whereby a full-color display device can be obtained.

In the case of manufacturing a display device including a plurality of light-emitting elements emitting light of different colors, at least layers (light-emitting layers) containing light-emitting materials different in emission color each need to be formed in an island shape. In a known method for separately forming part or the whole of an EL layer, an island-shaped organic film is formed by an evaporation method using a shadow mask such as a metal mask. However, this method has difficulty in achieving high resolution and a high aperture ratio of a display device because in this method, a deviation from the designed shape and position of the island-shaped organic film is caused by various influences such as the low accuracy of the metal mask position, the positional deviation between the metal mask and a substrate, a warp of the metal mask, and the vapor-scattering-induced expansion of the outline of the formed film. In addition, the outline of a layer may blur during vapor deposition, whereby the thickness of its end portion may be small. That is, the thickness of an island-shaped light-emitting layer may vary from area to area. In the case of manufacturing a display device with a large size, high definition, or high resolution, the manufacturing yield might be reduced because of low dimensional accuracy of the metal mask and deformation due to heat or the like. Thus, a measure has been taken for pseudo improvement in resolution (also referred to pixel density). As a specific measure, a unique pixel arrangement such as a PenTile pattern has been employed.

Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

In one embodiment of the present invention, fine patterning of an EL layer is performed by photolithography without a shadow mask such as a fine metal mask (FMM). With the patterning, a high-resolution display device with a high aperture ratio, which has been difficult to achieve, can be fabricated. Moreover, EL layers can be formed separately, enabling the display device to perform extremely clear display with high contrast and high display quality. Note that one embodiment of the present invention is not limited to the above structure. For example, a structure in which fine patterning of an EL layer is performed using both a metal mask and photolithography is also one embodiment of the present invention.

Part or the whole of the EL layer can be physically partitioned, inhibiting a leakage current flowing between adjacent light-emitting elements through a layer (also referred to as a common layer) shared by the light-emitting elements. This can prevent crosstalk due to unintended light emission, so that a display device with extremely high contrast can be obtained. Specifically, a display device having high current efficiency at low luminance can be obtained.

Note that a display device can also be obtained by combining white-light-emitting elements with a color filter. In that case, the light-emitting elements having the same structure can be provided in pixels (subpixels) emitting light of different colors, allowing all the layers to be common layers. Furthermore, part or the whole of the EL layer is partitioned by photolithography, which inhibits a leakage current from flowing through the common layers to achieve a display device with high contrast. In particular, when an element has a tandem structure in which a plurality of light-emitting layers are stacked with a highly conductive intermediate layer therebetween, a leakage current through the intermediate layer can be effectively prevented, achieving a display device with high luminance, high resolution, and high contrast.

In the case where the EL layer is processed into an island shape, when a resist mask is formed directly on the EL layer, a solvent or the like of a resin material to be the resist mask might dissolve part or the whole of the EL layer. Thus, in one embodiment of the present invention, a sacrificial layer is formed between the EL layer and the resist mask, preventing damage at the formation of the resist mask.

The sacrificial layer is preferably formed using a material soluble in a solvent that is unlikely to dissolve the EL layer and insoluble or poorly soluble in a solvent of the resin material to be the resist mask. In that case, after the EL layer is processed into an island shape, the sacrificial layer can be removed without causing damage to the EL layer. For example, a material soluble in water or alcohol is particularly preferably used for the sacrificial layer.

Furthermore, the resist mask and the EL layer are preferably formed using organic materials that can be etched in the same dry etching step. In that case, the resist mask does not need to be separated with a resist stripper or the like after processing of the EL layer, and can be removed in the etching step of the EL layer. This can prevent the EL layer from being unintentionally dissolved with the resist stripper. At this time, the sacrificial layer may be formed using an organic material that can be etched in the above dry etching step or a material that has etching resistance in the dry etching step.

The EL layer can be processed into an island shape in such a manner that, for example, a resist mask is formed immediately after formation of a light-emitting layer (a layer containing a light-emitting material) and then processing is performed. In such a method, damage to the light-emitting layer (e.g., processing damage) might be caused to significantly degrade the reliability. Thus, one embodiment of the present invention preferably employs a method in which a sacrificial layer and a resist mask are stacked over a layer above the light-emitting layer (e.g., a carrier-transport layer or a carrier-injection layer, and specifically an electron-transport layer or an electron-injection layer), and then the light-emitting layer is processed into an island shape. Such a method provides a highly reliable display device.

The interval between EL layers with different colors can be reduced to less than or equal to 3 µm, less than or equal to 2 µm, or less than or equal to 1 µm by the above-described method, whereas it is difficult to reduce the interval to less than 10 µm by a formation method using an FMM, for example. With the use of a light exposure tool for LSI, the interval between EL layers can be reduced to less than or equal to 500 nm, less than or equal to 200 nm, less than or equal to 100 nm, or even less than or equal to 50 nm, for example. Accordingly, the area of a non-light-emitting region that may exist between two light-emitting elements can be significantly reduced, and the aperture ratio can be close to 100%. For example, an aperture ratio higher than or equal to 50%, higher than or equal to 60%, higher than or equal to 70%, higher than or equal to 80%, or higher than or equal to 90% and lower than 100% can be achieved.

Furthermore, the size of the EL layer itself can be made much smaller than that in the case of using an FMM. For example, in the case where EL layers are separately formed using an FMM, the thickness differs between the center and the edge of an island-shaped EL layer, reducing an effective area that can be used as a light-emitting region with respect to the whole area of the EL layer. By contrast, in the above manufacturing method, a film deposited to have a uniform thickness is processed to form an island-shaped EL layer with a uniform thickness. Thus, even when the EL layer has a minute size, almost the whole area can be used as a light-emitting region. Thus, the above manufacturing method achieves both high resolution and a high aperture ratio.

As described above, with the above manufacturing method, a display device in which minute light-emitting elements are integrated can be obtained, and it is not necessary to conduct a pseudo improvement in resolution with a unique pixel arrangement such as a PenTile pattern. Thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction.

Here, it is preferable that a partition covering an end portion of the pixel electrode be not provided. When such a partition is used, a region of the pixel electrode that is covered with the partition is made a non-light-emitting region, reducing the aperture ratio accordingly. In one embodiment of the present invention, the end portion of the pixel electrode has a tapered shape, improving the step coverage with an EL film deposited over the pixel electrode; thus, the EL layer can be prevented from being partitioned by a step at the end portion of the pixel electrode without using the partition. As a result, the aperture ratio can be significantly increased.

More specific structure examples and manufacturing method examples of the display device of one embodiment of the present invention will be described below with reference to drawings.

Structure Example 1

FIG. 1A is a schematic top view of a display device 100 of one embodiment of the present invention. The display device 100 includes, over a substrate 101, a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A shows what is called a stripe arrangement, in which light-emitting elements of the same color are arranged in one direction. Note that the arrangement of the light-emitting elements is not limited thereto; another arrangement such as an S stripe, delta, Bayer, zigzag, PenTile, or diamond pattern may also be used.

As each of the light-emitting elements 110R, 110G, and 110B, an EL element such as an organic light-emitting diode (OLED) or a quantum-dot light-emitting diode (QLED) is preferably used. Examples of a light-emitting substance contained in the EL element include a substance exhibiting fluorescence (fluorescent material), a substance exhibiting phosphorescence (phosphorescent material), and a substance exhibiting thermally activated delayed fluorescence (a thermally activated delayed fluorescent (TADF) material). Examples of the light-emitting substance contained in the EL element include not only organic compounds but also inorganic compounds (e.g., quantum dot materials).

Figure 1B:
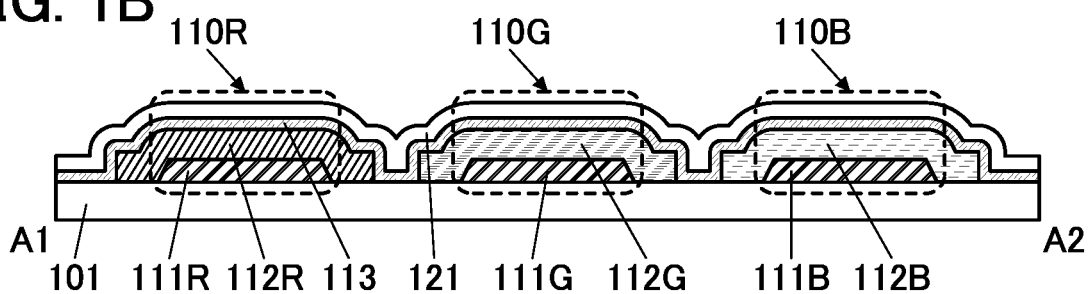
Figure 1C:
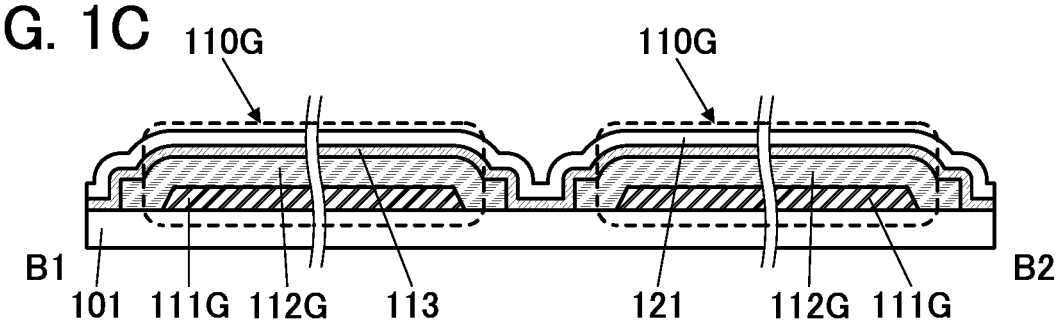

FIGS. 1B and 1C are the schematic cross-sectional views taken along dashed-dotted line A1-A2 and dashed-dotted line B1-B2 in FIG. 1A. FIG. 1B is a schematic cross-sectional view of the light-emitting element 110R, the light-emitting element 110G, and the light-emitting element 110B, and FIG. 1C is a schematic cross-sectional view of the two light-emitting elements 110G.

The light-emitting element 110R includes a pixel electrode 111R, an EL layer 112R, and a common electrode 113. The light-emitting element 110G includes a pixel electrode 111G, an EL layer 112G, and the common electrode 113. The light-emitting element 110B includes a pixel electrode 111B, an EL layer 112B, and the common electrode 113.

Hereafter, the term "light-emitting element 110" is sometimes used to describe matters common to the light-emitting elements 110R, 110G, and 110B. Likewise, in the description of matters common to the components that are distinguished using alphabets, such as the EL layers 112R, 112G, and 112B, reference numerals without such alphabets are sometimes used.

The light-emitting element 110R includes the EL layer 112R between the pixel electrode 111R and the common electrode 113. The EL layer 112R contains at least a light-emitting organic compound emitting red light. The EL layer 112G included in the light-emitting element 110G contains at least a light-emitting organic compound emitting green light. The EL layer 112B included in the light-emitting element 110B contains at least a light-emitting organic compound emitting blue light.

The EL layers 112R, 112G, and 112B may each include one or more of an electron-injection layer, an electron-transport layer, a hole-injection layer, and a hole-transport layer in addition to a layer containing a light-emitting compound (a light-emitting layer).

The pixel electrode 111R, the pixel electrode 111G, and the pixel electrode 111B are provided for the respective light-emitting elements. The common electrode 113 is provided as a continuous layer shared by the light-emitting elements. A conductive film that has a property of transmitting visible light is used for either the respective pixel electrodes or the common electrode 113, and a reflective conductive film is used for the other. When the respective pixel electrodes are light-transmitting electrodes and the common electrode 113 is a reflective electrode, a bottom-emission display device is obtained. When the respective pixel electrodes are reflective electrodes and the common electrode 113 is a light-transmitting electrode, a top-emission display device is obtained. Note that when both the respective pixel electrodes and the common electrode 113 transmit light, a dual-emission display device can be obtained.

The pixel electrode 111 (the pixel electrode 111R, the pixel electrode 111G, and the pixel electrode 111B) preferably has a tapered shape. This can improve the step coverage with the EL layer 112. Note that in this specification and the like, an end portion of an object having a tapered shape indicates that the end portion of the object has a cross-sectional shape in which the angle between a surface (side surface) of the object and a surface on which the object is formed is greater than 0° and less than 90°, and the thickness continuously increases from the end portion. A typical example of the shape of the end portion is the one in which a bottom end portion has an acute angle and a top end portion has an obtuse angle. Note that the side surface is preferably flat, but may be concave or convex, or may have a step-like shape. Although the pixel electrode 111 shown here has a single-layer structure, the pixel electrode 111 may include a plurality of layers stacked.

The pixel electrode 111 has a taper angle (the angle of the end portion formed between the surface (side surface) and the surface on which the object is formed) greater than 0° and less than 90°, preferably greater than or equal to 10° and less than or equal to 85°, further preferably greater than or equal to 20° and less than or equal to 80°, and still further preferably greater than or equal to 30° and less than or equal to 75°.

The EL layer 112 is provided to cover the pixel electrode 111. The EL layer 112 is provided in contact with a top surface and a side surface of the pixel electrode 111. An end portion of the EL layer 112 is positioned outside the pixel electrode 111. The end portion of the EL layer 112 is provided in contact with a top surface of a layer on which the pixel electrode 111 is formed (here, a top surface of the substrate 101).

The EL layer 112 is processed into an island shape by photolithography. Thus, the angle formed between a top surface and a side surface of the end portion of the EL layer 112 is approximately 90°. By contrast, an organic film formed using a fine metal mask (FMM) or the like has a thickness that tends to gradually decrease with decreasing distance to an end portion, and has a top surface forming a slope in an area extending greater than or equal to 1 μm and less than or equal to 10 μm from the end portion, for example; thus, such an organic film has a shape whose top surface and side surface cannot be easily distinguished from each other.

The EL layer 112 preferably has a taper angle greater than or equal to 45° and less than or equal to 135°, further preferably greater than or equal to 50° and less than or equal to 120°, still further preferably greater than or equal to 60° and less than or equal to 100°, and yet still further preferably greater than or equal to 70° and less than or equal to 90°. A taper angle less than or equal to 90° can improve the step coverage with a layer covering the EL layer 112 (e.g., the common electrode 113 and a protective layer 121). Meanwhile, a taper angle less than 30° requires a larger distance between light-emitting elements, which might decrease the aperture ratio.

The common electrode 113 is provided to cover the top surface and the side surface of the EL layer 112. Here, part of the common electrode 113 is provided in contact with the top surface of the layer on which the pixel electrode 111 is formed (here, the top surface of the substrate 101).

The protective layer 121 is provided to cover the common electrode 113. The protective layer 121 has a function of preventing diffusion of impurities such as water into each light-emitting element from above.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film With this structure, a top surface of the organic insulating film can be flat, and accordingly, coverage with the inorganic insulating film over the organic insulating film is improved, leading to an improvement in barrier properties. Moreover, since a top surface of the protective layer 121 is flat, a preferable effect can be obtained; when a component (e.g., a color filter, an electrode of a touch sensor, a lens array, or the like) is provided above the protective layer 121, the component is less affected by an uneven shape caused by the lower structure.

The protective layer 121 can have, for example, a single-layer structure or a stacked-layer structure at least including an inorganic insulating film Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 121.

Note that in this specification and the like, an oxynitride refers to a material in which an oxygen content is higher than a nitrogen content, and a nitride oxide refers to a material in which a nitrogen content is higher than an oxygen content. For example, silicon oxynitride refers to a material in which an oxygen content is higher than a nitrogen content, and silicon nitride oxide refers to a material in which a nitrogen content is higher than an oxygen content.

In the case where the common electrode 113 has a stacked-layer structure of a conductive layer including a metal and a light-transmitting conductive layer, the light-transmitting conductive layer can be referred to as the protective layer 121. Particularly when a microcavity is used, the conductive layer including a metal needs to be thin enough to have a light-transmitting property; the light-transmitting conductive layer including a metal oxide to be stacked preferably has a larger thickness than the conductive layer including a metal. For the conductive layer including a metal oxide, a conductive material such as indium tin oxide or indium zinc oxide can be used.

As illustrated in FIG. 1C, the EL layer 112 is preferably partitioned also between the light-emitting elements 110 of the same color. This inhibits crosstalk due to a leakage current between the light-emitting elements 110 of the same color, thereby displaying a high-contrast image with the outline clear, not blurred.

Manufacturing Method Example 1

A manufacturing method example of the display device of one embodiment of the present invention will be described below with reference to drawings. Here, the description is made with use of the display device 100 shown above in Structure example. FIGS. 2A to 2F and FIGS. 3A to 3E are cross-sectional schematic views of steps in the manufacturing method of the display device described as an example below.

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of the thermal CVD method is a metal organic CVD (MOCVD) method.

Thin films included in the display device (e.g., insulating films, semiconductor films, and conductive films) can also be formed by a method such as spin coating, dipping, spray coating, ink-jetting, dispensing, screen printing, offset printing, doctor blade coating, slit coating, roll coating, curtain coating, or knife coating.

Thin films included in the display device can be processed by a photolithography method, for example. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light used for light exposure in the photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV light, X-rays, or an electron beam because extremely minute processing can be performed. Note that when exposure is performed by scanning of a beam such as an electron beam, a photomask is not needed.

For etching of thin films, a dry etching method, a wet etching method, a sandblast method, or the like can be used.
{Preparation for Substrate 101}

As the substrate 101, a substrate that has heat resistance high enough to withstand at least heat treatment performed later can be used. As the substrate 101 having an insulating property, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate of silicon, silicon carbide, or the like; a compound semiconductor substrate of silicon germanium or the like; or an SOI substrate.

As the substrate 101, it is particularly preferable to use the above-described semiconductor substrate or insulating substrate where a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.
{Formation of Pixel Electrodes 111R, 111G, and 111B}

Figure 2A:
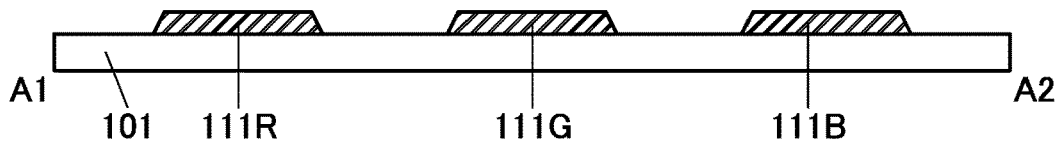
FIGS. 2A to 2F illustrate a manufacturing method example of a display device.

Next, a plurality of pixel electrodes 111 are formed over the substrate 101 (FIG. 2A). First, a conductive film to be a pixel electrode is deposited, a resist mask is formed by a photolithography method, and an unnecessary portion of the conductive film is removed by etching. After that, the resist mask is removed to form the pixel electrodes 111R, 111G, and 111B.

At this time, etching is preferably performed so that the pixel electrodes 111R, 111G, and 111B each have a tapered shape. The tapered shape can be obtained by, for example, performing dry etching under the condition that the resist mask can be etched concurrently with the conductive film Note that the processing method for obtaining the tapered shape is not limited thereto and the tapered shape can also be obtained by wet etching in some cases.

In the case where a conductive film that has a property of reflecting visible light is used as the pixel electrodes 111, it is preferable to use a material having as high a reflectivity as possible in the entire wavelength range of visible light (e.g., silver or aluminum). This can increase both light extraction efficiency and color reproducibility of the light-emitting elements. A light-transmitting conductive film may be stacked over a reflective conductive film, and the light-transmitting conductive film may have a thickness different between the light-emitting elements.
{Formation of EL Film 112Rf}

Figure 2B:
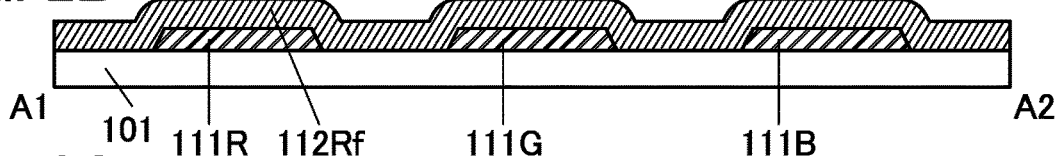

Subsequently, an EL film 112Rf to be the EL layer 112R is deposited over the pixel electrodes 111R, 111G, and 111B (FIG. 2B).

The EL film 112Rf includes at least a film containing a light-emitting compound. In addition to this, one or more films functioning as an electron-injection layer, an electron-transport layer, a charge-generation layer, a hole-transport layer, and a hole-injection layer may be stacked. The EL film 112Rf can be formed by, for example, an evaporation method, a sputtering method, an inkjet method, or the like. Without limitation to this, the above-described deposition method can be used as appropriate.
{Formation of Sacrificial Film 141a}

Figure 2C:
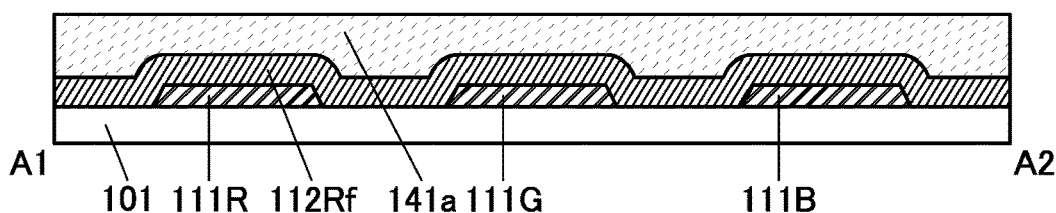

Subsequently, a sacrificial film 141a is formed over the EL film 112Rf (FIG. 2C). A method suitable for the formation of the sacrificial film 141a is a wet deposition method such as spin coating, dipping, spray coating, ink-jetting, dispensing, screen printing, offset printing, doctor blade coating, slit coating, roll coating, curtain coating, or knife coating. Other deposition methods such as an evaporation method and the above-described deposition methods can also be used as appropriate.

The sacrificial film 141a is preferably formed using a material that can be dissolved in a solvent chemically stable with respect to at least the uppermost film of the EL film 112Rf. Specifically, a material that will be dissolved in water or alcohol can be suitably used for the sacrificial film 141a. In deposition of the sacrificial film 141a, it is preferable that application of such a material dissolved in a solvent such as water or alcohol be performed by the aforementioned wet process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

For the sacrificial film 141a, a water-soluble or alcohol-soluble organic material is preferably used. Examples of the organic material include polyvinyl alcohol (PVA), polyvinyl butyral, polyvinylpyrrolidone, polyethylene glycol, polyglycerin, pullulan, water-soluble cellulose, or an alcohol-soluble polyamide resin.

{Formation of Resist Mask 143a}

Figure 2D:
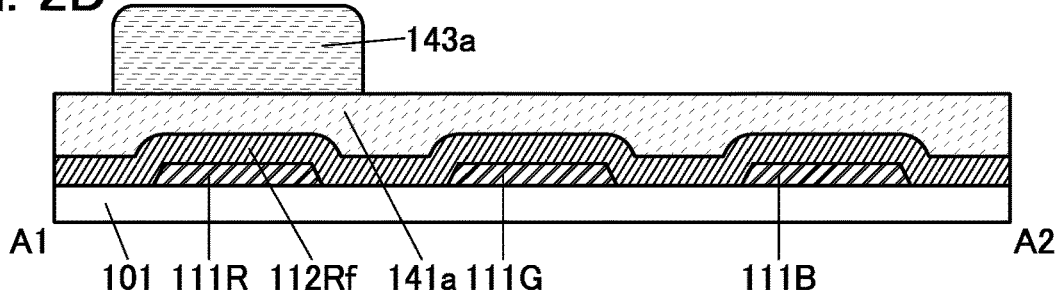

Next, a resist mask 143a is formed in a region that is over the sacrificial film 141a and overlaps with the pixel electrode 111R (FIG. 2D). The resist mask 143a is preferably formed using an organic resin material that can be etched under the same etching condition as the sacrificial film 141a.

For the resist mask 143a, a resist material containing a photosensitive resin such as a positive type resist material or a negative type resist material can be used.

{Etching of Sacrificial Film 141a, Resist Mask 143a, and EL Film 112Rf}

Figure 2E:
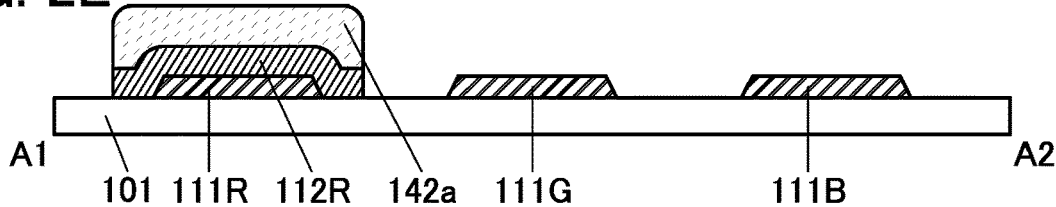

Then, the sacrificial film 141a, the resist mask 143a, and the EL film 112Rf are etched to expose part of the top surface of the substrate 101, a top surface of the pixel electrode 111G, and a top surface of the pixel electrode 111B (FIG. 2E). At this time, the etching conditions are determined so that parts of the sacrificial film 141a and the EL film 112Rf, which are not covered with the resist mask 143a, are removed and the sacrificial film 141a over the pixel electrode 111R remains. Thus, the island-shaped EL layer 112R and a sacrificial layer 142a over the EL layer 112R can be formed.

The etching is preferably performed under the conditions that the sacrificial film 141a, the resist mask 143a, and the EL film 112Rf can be etched. It is particularly preferable to perform anisotropic dry etching, which can prevent an exposed side surface of the EL layer 112R from being etched and the pattern of the EL layer 112R from being reduced after the etching.

The sacrificial film 141a, the resist mask 143a, and the EL film 112Rf are preferably etched by anisotropic dry etching using an etching gas containing oxygen, in which case the etching rate can be increased. Note that the etching gas is not limited thereto, and a hydrogen gas, a nitrogen gas, an oxygen gas, an ammonia gas, or a gas containing fluorine such as $CF_4$ or $SF_6$ can be used as the etching gas, for example. A mixed gas of two or more of the above gases may also be used. Alternatively, a gas in which a noble gas such as argon, helium, xenon, or krypton is mixed in any of the above gases may be used as the etching gas.

Note that the sacrificial film 141a, the resist mask 143a, and the EL film 112Rf may be individually etched or any two of them may be etched in the same step. For example, the sacrificial film 141a may be etched first; then, the resist mask 143a and the EL film 112Rf may be etched in the same step.

The sacrificial layer 142a preferably remains over the EL layer 112R when the etching is completed. This enables the sacrificial layer 142a to function as a protective layer that protects the EL layer 112R from damage in a later step.

{Formation of EL Film 112Gf}

Subsequently, an EL film 112Gf to be the EL layer 112G is deposited over the sacrificial layer 142a, the pixel electrode 111G, and the pixel electrode 111B.

The description of the EL film 112Rf can be referred to for the formation method of the EL film 120Gf.

{Formation of Sacrificial Film 141b}

Subsequently, a sacrificial film 141b is formed over the EL film 112Gf. The sacrificial film 141b can be formed in a manner similar to that for the sacrificial film 141a. In particular, the sacrificial film 141b and the sacrificial film 141a are preferably formed using the same material.

{Formation of Resist Mask 143b}

Figure 2F:
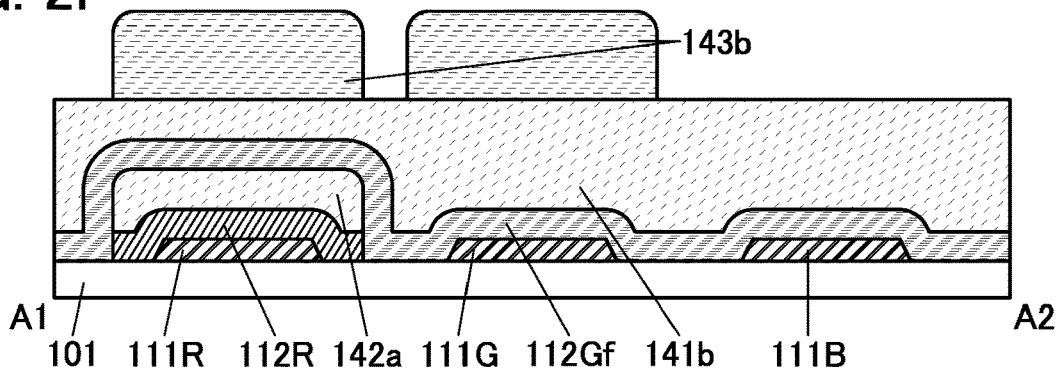

Next, a resist mask 143b is formed over the sacrificial film 141b (FIG. 2F). The resist mask 143b is formed in a region overlapping with the pixel electrode 111G and a region overlapping with the pixel electrode 111R.

The description of the resist mask 143a can be referred to for the formation method of the resist mask 143b.

{Etching of Sacrificial Film 141b, Resist Mask 143b, and EL Film 112Gf}

Figure 3A:
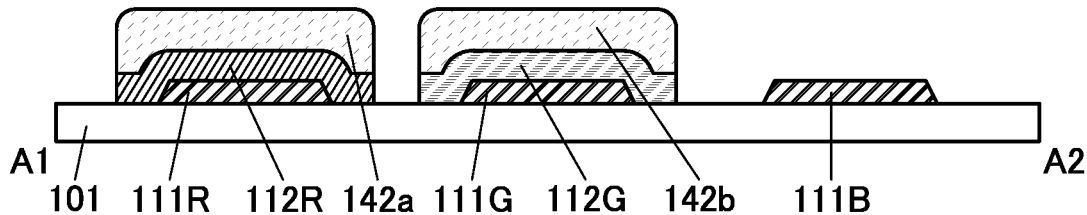
FIGS. 3A to 3E illustrate a manufacturing method example of a display device.

Then, the sacrificial film 141b, the resist mask 143b, and the EL film 112Gf are etched to expose part of the top surface of the substrate 101 and the top surface of the pixel electrode 111B (FIG. 3A). Thus, the island-shaped EL layer 112G and a sacrificial layer 142b can be formed. For the etching method, the description of etching of the sacrificial film 141a, the resist mask 143a, and the EL film 112Rf can be referred to.

The etching is preferably performed under the conditions that the sacrificial film 141b, the resist mask 143b, and the EL film 112Gf can be etched. For example, when the etching is performed by anisotropic dry etching, part of the sacrificial film 141b over the pixel electrode 111B, which is not covered with the resist mask 143b, disappears faster than the other part covered with the resist mask 143b, so that the sacrificial layer 142b can remain.

In the case where the etching is performed by single etching treatment, the treatment is stopped when the etching of the EL film 112Gf is completed. Thus, as illustrated in FIG. 3A, the sacrificial layer 142a over the EL layer 112R can remain without disappearing.

{Formation of EL Film 112Bf}

Subsequently, an EL film 112Bf to be the EL layer 112B is deposited over the sacrificial layer 142a, the sacrificial layer 142b, and the pixel electrode 111B.

The description of the EL film 112Rf can be referred to for the formation method of the EL film 120Bf.

{Formation of Sacrificial Film 141c}

Subsequently, a sacrificial film 141c is formed over the EL film 112Bf. The sacrificial film 141c can be formed in a manner similar to that for the sacrificial film 141a. In particular, the sacrificial film 141c, the sacrificial film 141a, and the sacrificial film 141b are preferably formed using the same material.

{Formation of Resist Mask 143c}

Figure 3B:
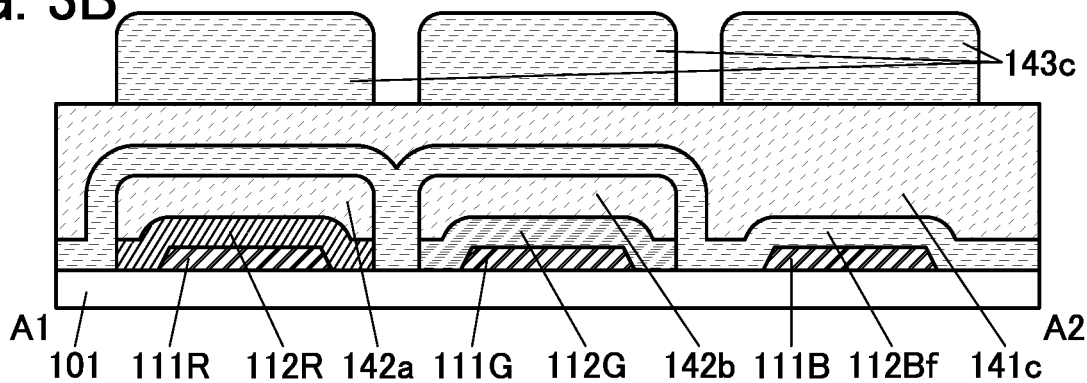

Next, a resist mask 143c is formed over the sacrificial film 141c (FIG. 3B). The resist mask 143c is formed in a region overlapping with the pixel electrode 111R, a region overlapping with the pixel electrode 111G, and a region overlapping with the pixel electrode 111B.

The description of the resist mask 143a can be referred to for the formation method of the resist mask 143c.

{Etching of Sacrificial Film 141c, Resist Mask 143c, and EL Film 112Bf}

Figure 3C:
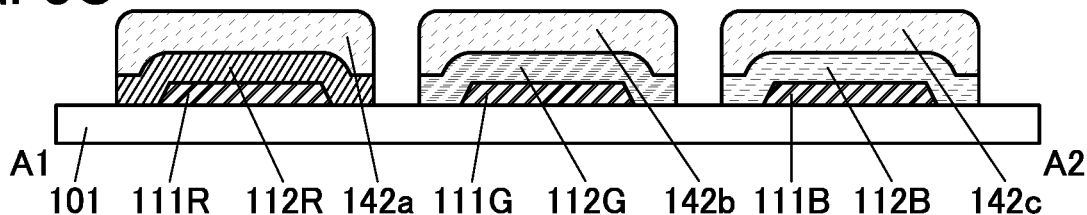

Then, the sacrificial film 141c, the resist mask 143c, and the EL film 112Bf are etched to expose part of the top surface of the substrate 101 (FIG. 3C). Thus, the island-shaped EL layer 112B and a sacrificial layer 142c can be formed.

For the etching method, the description of etching of the sacrificial film 141a, the resist mask 143a, and the EL film 112Rf can be referred to. The etching allows the sacrificial layer 142a over the EL layer 112R and the sacrificial layer 142b over the EL layer 112G to remain without disappearing.

{Removal of Sacrificial Layers}

Figure 3D:
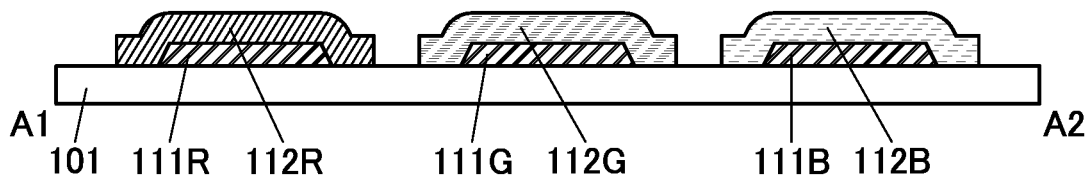

Next, the sacrificial layers 142a, 142b, and 142c are removed, whereby top surfaces of the EL layers 112R, 112G, and 112B are exposed (FIG. 3D).

The sacrificial layers 142a, 142a, and 142c can be removed by wet etching or dry etching. At this time, a method that causes damage to the EL layers 112R, 112G, and 112B as little as possible is preferably employed. In particular, a wet etching method is preferably used.

In particular, the sacrificial layers 142a, 142b, and 142c are preferably removed by being dissolved in a solvent such as water or alcohol.

Examples of the alcohol in which the sacrificial layers 142a, 142b, and 142c can be dissolved include ethyl alcohol, methyl alcohol, isopropyl alcohol (IPA), and glycerin.

After the sacrificial layers 142a, 142b, and 142c are removed, drying treatment is preferably performed in order to remove water contained in the EL layers 112R, 112G, and 112B and water adsorbed on the surfaces of the EL layers 112R, 112G, and 112B. For example, heat treatment is preferably performed in an inert gas atmosphere or a reduced-pressure atmosphere. The heat treatment can be performed with a substrate temperature higher than or equal to 50° C. and lower than or equal to 200° C., preferably higher than or equal to 60° C. and lower than or equal to 150° C., and further preferably higher than or equal to 70° C. and lower than or equal to 120° C.

The heat treatment is preferably performed in a reduced-pressure atmosphere because drying at a lower temperature is possible.

Through the above steps, the three kinds of EL layers can be separately formed.

{Formation of Common Electrode 113}

Next, the common electrode 113 is formed to cover the EL layers 112R, 112G, and 112B. The common electrode 113 can be formed by a sputtering method or a vacuum evaporation method, for example.

The common electrode 113 is not necessarily deposited over the entire surface of the substrate 101; preferably, with the use of a shielding mask (also referred to as a metal mask or a rough metal mask) to define a deposition area, the common electrode 113 is deposited in a predetermined region including a region where the light-emitting elements are provided and a region where electrodes electrically connected to the common electrode 113 are provided.

Through the above steps, the light-emitting element 110R, the light-emitting element 110G, and the light-emitting element 110B can be manufactured.

{Formation of Protective Layer 121}

Figure 3E:
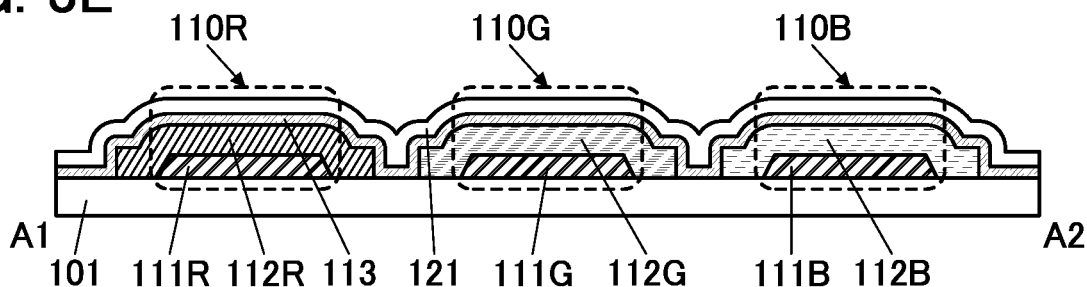

Next, the protective layer 121 is formed over the common electrode 113 (FIG. 3E). An inorganic insulating film used for the protective layer 121 is preferably deposited by a sputtering method, a PECVD method, or an ALD method. In particular, the ALD method is preferable because a film deposited by ALD has good step coverage and is less likely to cause a defect such as pinhole. An organic insulating film is preferably deposited by an ink-jet method because a uniform film can be formed in a desired area.

The above is the description of the manufacturing method example of the display device.

Structure Example 2

A structure example of the display device partly different from Structure example 1 will be described below. Note that portions similar to those described above are not denoted below in some cases.

Structure Example 2-1

Figure 4A:
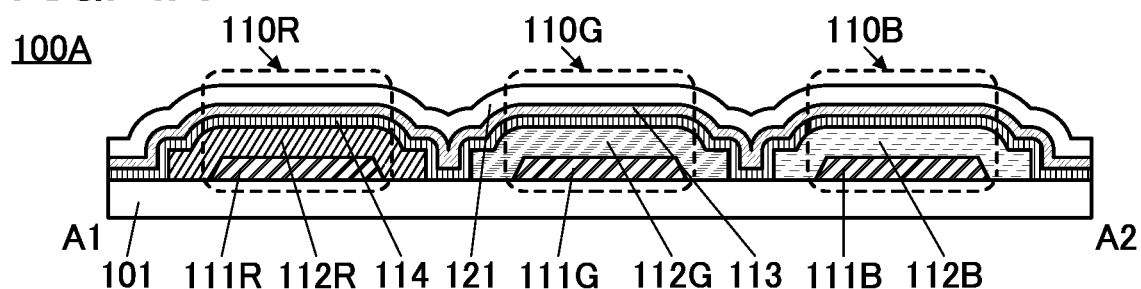
FIGS. 4A to 4C each illustrate a structure example of a display device.

A display device 100A illustrated in FIG. 4A is different from the display device 100 mainly in including a common layer 114.

Like the common electrode 113, the common layer 114 is provided across a plurality of light-emitting elements. The common layer 114 is provided to cover the EL layers 112R, 112G, and 112B. The manufacturing process can be simplified by including the common layer 114, reducing the manufacturing cost. The common layer 114 can be formed by, for example, a deposition method such as a vacuum evaporation method or a sputtering method after the removal of the sacrificial layer and before the formation of the common electrode 113 in Manufacturing method example 1.

Each of the EL layers 112R, 112G, and 112B preferably includes at least a light-emitting layer containing a light-emitting material emitting one color. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

In the above case, it is preferable that a light-emitting layer in the EL layer 112 not be positioned closest to the common layer 114. In particular, the layer in the EL layer 112 that is positioned closest to the common layer 114 is preferably an electron-transport layer or a hole-transport layer. This can prevent a top surface of the light-emitting layer from being exposed to the air in the manufacturing process of the display device, so that a highly reliable display device can be achieved.

Structure Example 2-2

Figure 4B:
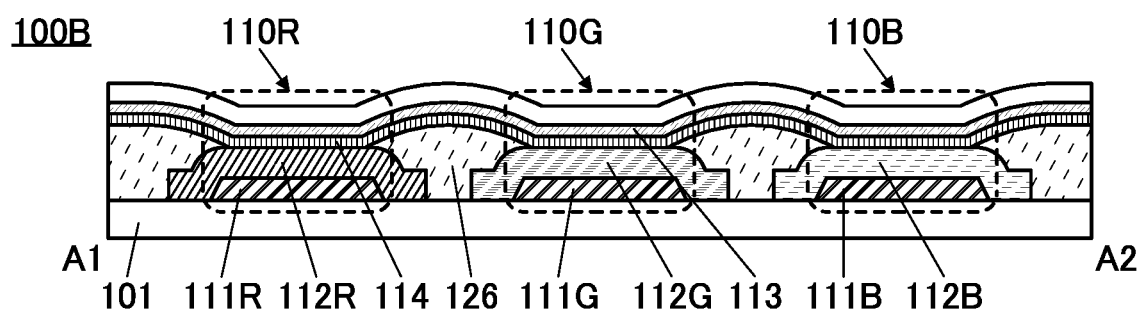

A display device 100B illustrated in FIG. 4B is different from the display device 100A mainly in including a resin layer 126.

The resin layer 126 is positioned between two adjacent light-emitting elements. The resin layer 126 is provided to cover end portions of the EL layer 112. The common layer 114 is provided to cover the resin layer 126. End portions of the resin layer 126 are preferably tapered.

The resin layer 126 functions as a planarization film that fills a step between the two adjacent light-emitting elements. The resin layer 126 can prevent the common electrode 113 from being partitioned (or disconnected) by a step at an end portion of the EL layer 112, and the common electrode over the EL layer 112 from being insulated. The resin layer 126 can also be referred to as local filling planarization (LFP).

In the case where the resin layer 126 is provided in contact with the EL layer 112, the resin layer 126 can be formed using a material dissolved in a solvent in which the EL layer 112 is not dissolved. Any of the materials that can be used for the sacrificial film can be suitably used for the resin layer 126.

Structure Example 2-3

Figure 4C:
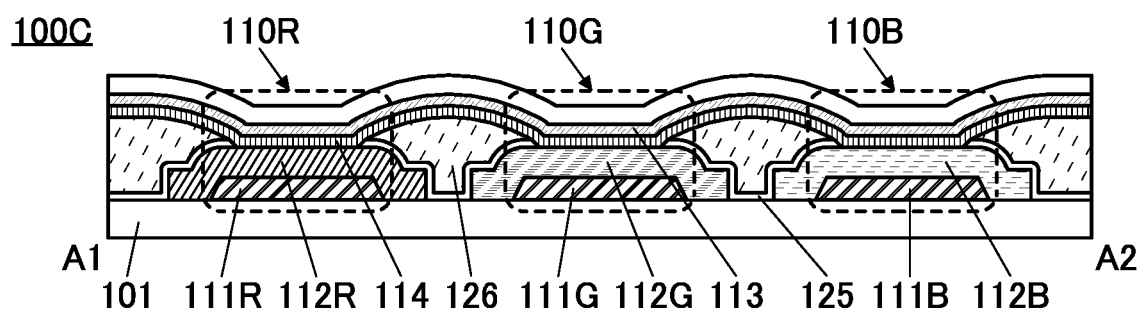

A display device 100C illustrated in FIG. 4C is different from the display device 100B mainly in including an insulating layer 125.

The insulating layer 125 is provided in contact with side surfaces and top end portions of the EL layer 112. Part of the insulating layer 125 is provided in contact with the top surface of the substrate 101.

The insulating layer 125 is positioned between the resin layer 126 and the EL layer 112 to serve as a protective film for preventing contact between the resin layer 126 and the EL layer 112. In the case where the resin layer 126 is in contact with the EL layer 112, the EL layer 112 might be dissolved by an organic solvent or the like used in formation of the resin layer 126. In view of this, the insulating layer 125 is provided between the EL layer 112 and the resin layer 126 as described in this embodiment to protect the side surface of the organic layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is used for the insulating layer 125, the insulating layer 125 has a small number of pin holes and excels in a function of protecting the EL layer.

The insulating layer 125 can be formed by a sputtering method, a CVD method, a PLD method, an ALD method, or the like. The insulating layer 125 is preferably formed by an ALD method achieving good coverage.

An insulating layer containing an organic material can be suitably used as the resin layer 126. Examples of materials used for the resin layer 126 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. The resin layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

A photosensitive resin can also be used for the resin layer 126. A photoresist may be used for the photosensitive resin. As the photosensitive resin, a positive photosensitive material or a negative photosensitive material can be used.

Between the insulating layer 125 and the resin layer 126, a reflective film (e.g., a metal film containing one or more of silver, palladium, copper, titanium, aluminum, and the like) may be provided to reflect the light that is emitted from the light-emitting layer. In this case, the light extraction efficiency can be increased.

Structure Example 2-4

Figure 5A:
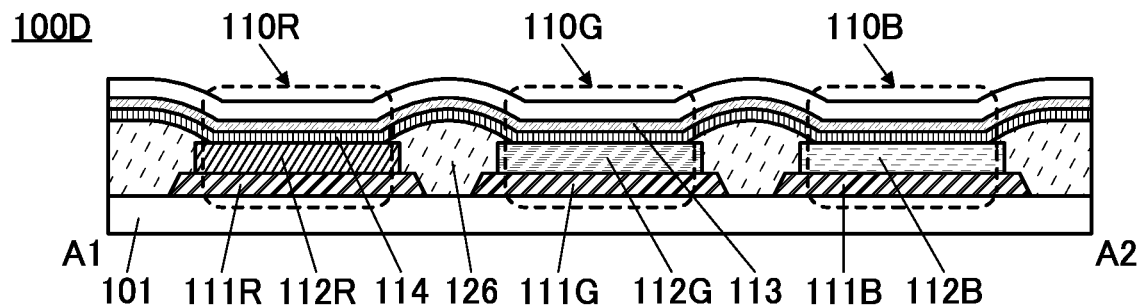
FIGS. 5A to 5D each illustrate a structure example of a display device.

A display device 100D illustrated in FIG. 5A is different from the display device 100B mainly in the shape of the EL layer 112. A display device 100E illustrated in FIG. 5B is an example in which the insulating layer 125 of the display device 100C is used for the display device 100D.

Figure 5B:
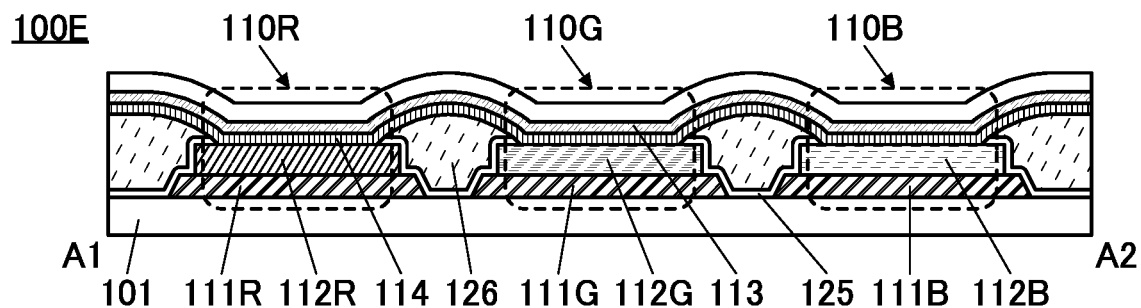

FIGS. 5A and 5B each illustrate an example in which the width of the EL layer 112 is smaller than that of the pixel electrode 111. In other words, the end portion of the EL layer 112 is positioned over the pixel electrode 111.

The resin layer 126 is provided to cover the end portion of the pixel electrode 111. This can prevent an electrical short circuit between the common electrode 113 and the pixel electrode 111.

In FIG. 5B, the insulating layer 125 is provided in contact with top and side surfaces of the EL layer 112, top and side surfaces of the pixel electrode, and the top surface of the substrate 101.

Structure Example 2-5

Figure 5C:
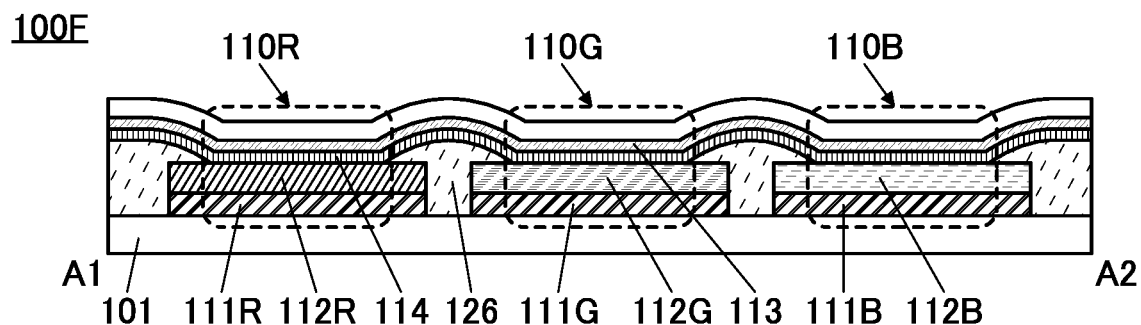
Figure 5D:
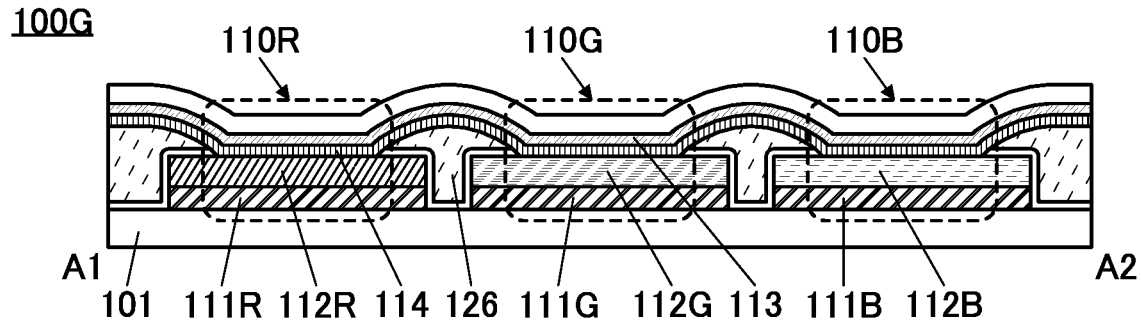

A display device 100F illustrated in FIG. 5C is another example of the display device 100D illustrated in FIG. 5A, in which the pixel electrode 111 and the EL layer 112 have substantially the same width. A display device 100G illustrated in FIG. 5D is another example of the display device 100F, to which the insulating layer 125 is added.

Structure Example 2-6

Figure 6A:
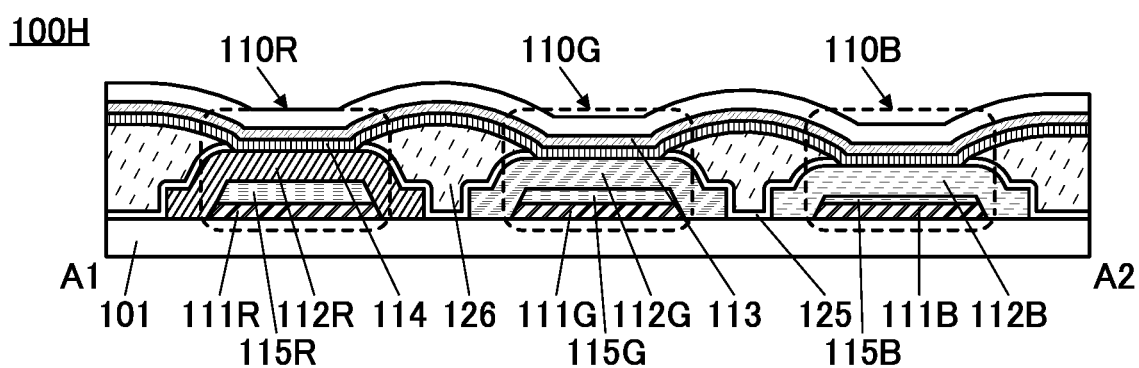
FIGS. 6A and 6B each illustrate a structure example of a display device.

A display device 100H illustrated in FIG. 6A is different from the display device 100C mainly in including an optical adjustment layer.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

The optical adjustment layers 115R, 115G, and 115B each have a property of transmitting visible light. The optical adjustment layers 115R, 115G, and 115B have different thicknesses. Thus, the optical path lengths of the light-emitting elements can differ from one another.

Here, a conductive film that has a property of reflecting visible light is used for the pixel electrode 111R, the pixel electrode 111G, and the pixel electrode 111B, and a conductive film that has properties of reflecting and transmitting visible light is used for the common electrode 113. In that case, each light-emitting element has what is called a microcavity structure to intensify light with a specific wavelength. As a result, a display device with high color purity can be achieved.

A conductive material that has a property of transmitting visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrodes 111R, 111G, and 111B and before the formation of the EL film 112Rf. The optical adjustment layers may be formed using conductive films with different thicknesses from each other or may have a single-layer structure, a two-layer structure, or a three-layer structure, in the order of thin thickness.

When the light-emitting element has a microcavity structure, the emission intensity of light with a specific wavelength can be increased, so that color purity can be improved and light with different wavelengths (monochromatic light) can be extracted even if the same EL layer is used. A combination of the microcavity structure with coloring layers (color filters) is also possible. Furthermore, the emission intensity of light with a specific wavelength in the front direction can be increased, whereby power consumption can be reduced.

When the pixel electrode 111 of the light-emitting element is a reflective electrode having a structure in which a reflective conductive film and a light-transmitting conductive film are stacked, the light-transmitting conductive film functions as an optical adjustment layer and optical adjustment can be performed by controlling the thickness of the light-transmitting conductive film. Specifically, when the wavelength of light from the light-emitting layer is $\lambda$, the distance between the pixel electrode 111 and the common electrode 113 is preferably adjusted to around $m\lambda/2$ (m is a natural number).

To amplify desired light (wavelength: $\lambda$) obtained from the light-emitting layer, the optical path length from the pixel electrode 111 to a region where desired light is obtained (a light-emitting region) in the light-emitting layer and the optical path length from the common electrode 113 to the light-emitting region in the light-emitting layer are preferably adjusted to around $(2 m'+1)\lambda/4$ (m' is a natural number). Here, the light-emitting region means a region where holes and electrons are recombined in the light-emitting layer.

By such optical adjustment, the spectrum of light obtained from the light-emitting element 110 can be narrowed and light emission with high color purity can be obtained.

Structure Example 2-7

Figure 6B:
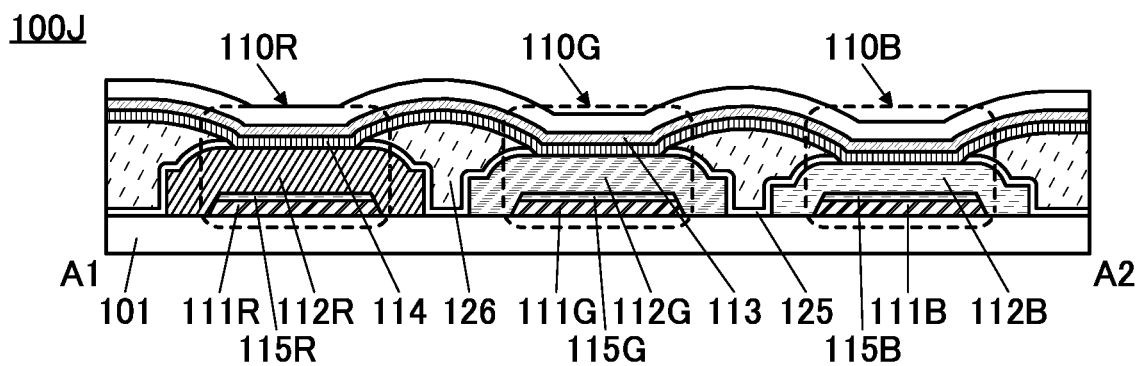

A display device 100J illustrated in FIG. 6B is different from the display device 100H mainly in the structures of the optical adjustment layer and the EL layer.

The display device 100J shows an example where a microcavity structure is achieved with the thicknesses of the EL layers 112R, 112G, and 112B. Such a structure does not require an optical adjustment layer provided additionally, simplifying the process.

For example, in the display device 100J, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

Although FIG. 6B illustrates an example in which the optical adjustment layers 115R, 115G, and 115B having the same thickness are provided, these layers are not necessarily provided.

Structure Example 3

An example of using a white-light-emitting element will be described below.

Figure 7A:
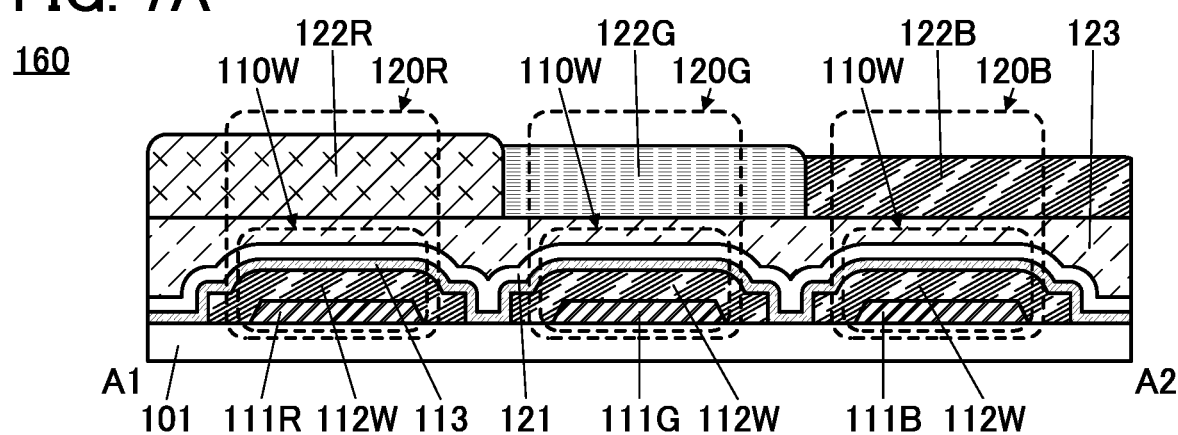
FIGS. 7A and 7B each illustrate a structure example of a display device.

FIG. 7A is a schematic cross-sectional view of a display device 160. FIG. 1A can be referred to for the top view.

The display device 160 includes a light-emitting unit 120R, a light-emitting unit 120G, and a light-emitting unit 120B. The light-emitting units 120R, 120G, and 120B each include a light-emitting element 110W. The light-emitting element 110W includes the pixel electrode 111, an EL layer 112W, and the common electrode 113. The EL layer 112W and the common electrode 113 are shared by a plurality of pixels. The EL layer 112W includes a light-emitting layer that emits white light. The light-emitting element 110W is a light-emitting element that emits white light.

The protective layer 121 is provided to cover the light-emitting element 110R, and a protective layer 123 is provided over the protective layer 121. The protective layer 123 functions as a planarization film. The protective layer 123 is not necessarily provided.

The light-emitting unit 120R, the light-emitting unit 120G, and the light-emitting unit 120B include a coloring layer 122R, a coloring layer 122G, and a coloring layer 122B, respectively, over the protective layer 123. For example, the coloring layer 122R, the coloring layer 122G, and the coloring layer 122B transmit red light, green light, and blue light, respectively. This enables fabrication of a full-color display device. Since each coloring layer is formed over the protective layer 123, the positional alignment of the light-emitting elements and the coloring layers is easy compared with the case where the coloring layers are formed over a substrate different from the substrate 101 and then the two substrates are bonded to each other. Thus, a display device with extremely high resolution can be achieved. In addition, the distance between the coloring layers and the light-emitting element 110W can be shortened, which inhibits color mixture and also improves the viewing angle characteristics of luminance and chromaticity.

Here, the EL layer 112W is partitioned between different light-emitting units. This suitably prevents unintentional light emission (also referred to as crosstalk) from being caused by a current flowing through the EL layer 112W between adjacent light-emitting units. As a result, the contrast can be increased to achieve a display device with high display quality.

Figure 7B:
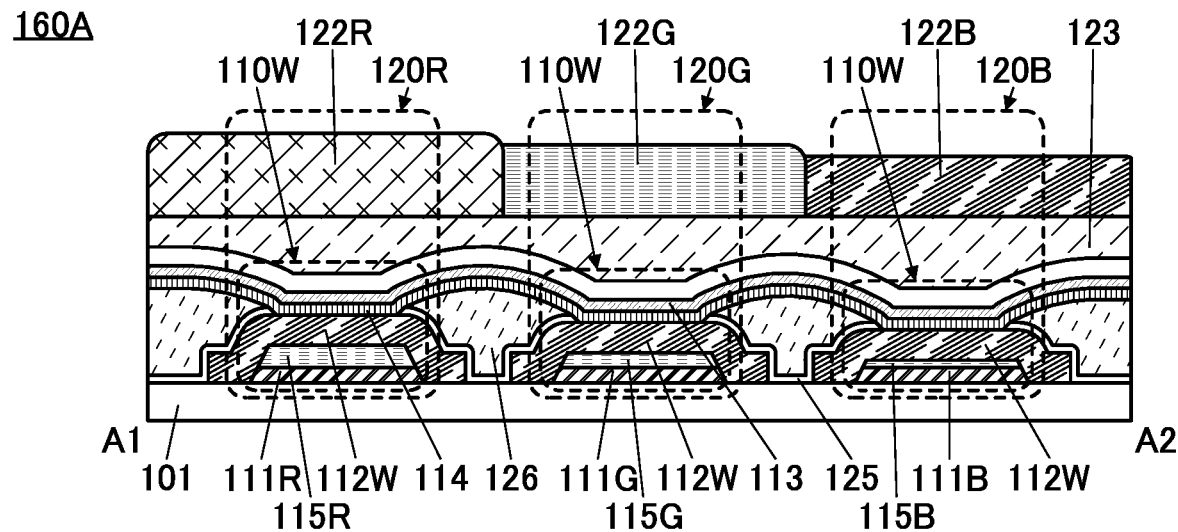

FIG. 7B is a schematic cross-sectional view of a display device 160A.

The light-emitting element 110W of the display device 160A includes the optical adjustment layers 115R, 115G, and 115B having different thicknesses. This achieves a microcavity structure so that light emission with high color purity can be obtained from each light-emitting unit.

The insulating layer 125 and the resin layer 126 are provided between two adjacent light-emitting elements 110.

FIGS. 7A and 7B show that the coloring layer 122R has the largest thickness and the coloring layer 122B has the smallest thickness in the three coloring layers. However, one embodiment of the present invention is not limited thereto, and all the coloring layers may have substantially the same thickness.

Manufacturing Method Example 2

A manufacturing method example of a display device using a white-light-emitting element will be described below. Note that for the portions similar to those in Manufacturing method example 1, the above description is referred to and the repeated description is skipped in some cases.

As in Manufacturing method example 1, the pixel electrodes 111R, 111G, and 111B are formed over the substrate 101.

Figure 8A:
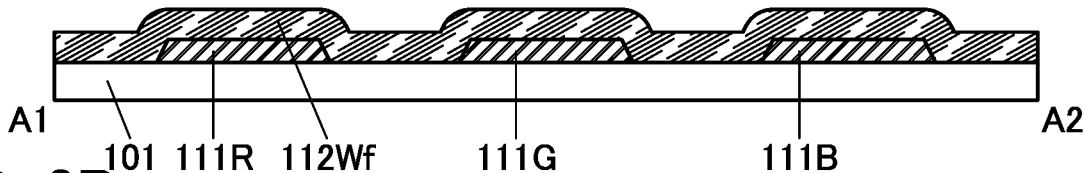
FIGS. 8A to 8F illustrate a manufacturing method example of a display device.

Subsequently, an EL film 112Wf to be the EL layer 112W is deposited over the pixel electrodes 111R, 111G, and 111B (FIG. 8A).

Figure 8B:
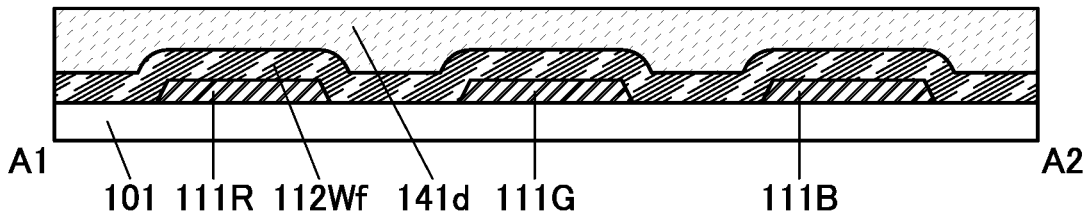

Subsequently, a sacrificial film 141d is formed over the EL film 112Wf (FIG. 8B).

Figure 8C:
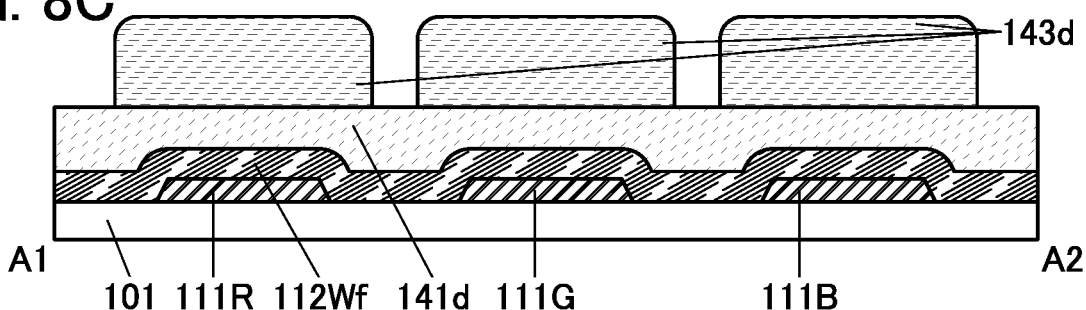

Next, an island-shaped resist mask 143d is formed over the sacrificial film 141d (FIG. 8C). The resist mask 143d is provided in a region overlapping with the pixel electrode 111R, a region overlapping with the pixel electrode 111G, and a region overlapping with the pixel electrode 111B.

Figure 8D:
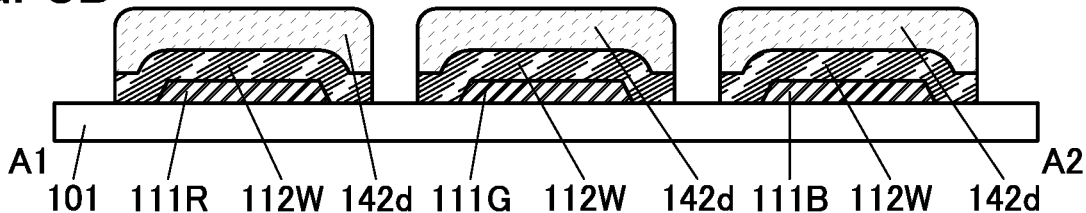

The sacrificial film 141d, the EL film 112Wf, and the resist mask 143d are etched by anisotropic dry etching to expose part of the top surface of the substrate 101 (FIG. 8D). Thus, the island-shaped EL layer 112W and a sacrificial layer 142d over the EL layer 112W are formed over each of the pixel electrodes 111R, 111G, and 111B. The resist mask 143d is preferably removed when the etching is completed.

Figure 8E:
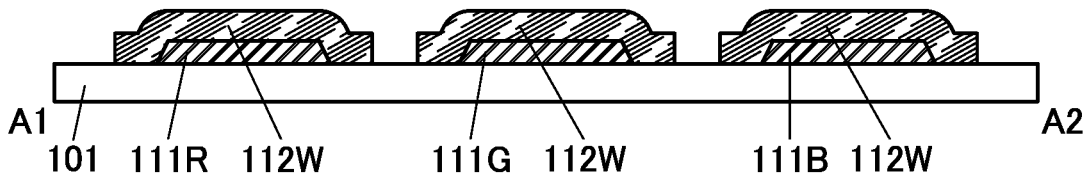

Subsequently, the sacrificial film 142d is removed to expose a top surface of the EL layer 112W (FIG. 8E). In particular, the sacrificial layer 142d is preferably removed by wet etching using water or alcohol.

Figure 8F:
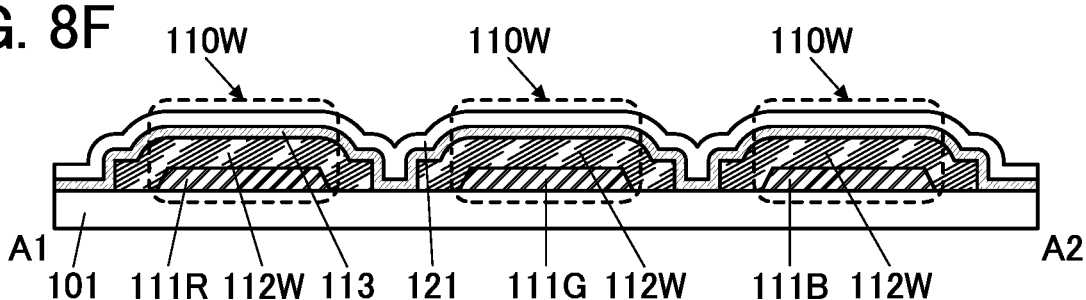

After that, the common electrode 113 and the protective layer 121 are formed in this order, whereby a plurality of light-emitting elements 110W can be obtained (FIG. 8F).

In the case of employing the structure of FIG. 7A, the protective layer 123 is further formed over the protective layer 121, and the coloring layer 122R, the coloring layer 122G, and the coloring layer 122B are formed over the protective layer 123. For the protective layer 123, a resin material having a light-transmitting property can be used. Each of the coloring layers can be formed by a photolithography method using a photosensitive resin material containing pigment or the like. Heat treatment (e.g., pre-baking or post-baking for curing a resin) at the formation of the protective layer 123 and the coloring layers is preferably performed at lower temperatures because thermal damage to the light-emitting element 110W can be reduced. For example, the heat treatment is performed at a temperature higher than or equal to 80° C. and lower than or equal to 200° C., preferably higher than or equal to 85° C. and lower than or equal to 150° C., and further preferably higher than or equal to 90° C. and lower than or equal to 130° C.

Through the above steps, the display device 160 described as an example in Structure example 3 can be manufactured.

[Pixel Layout]

Pixel layouts different from the layout in FIG. 1A will be mainly described below. There is no particular limitation on the arrangement of the light-emitting elements (subpixels), and a variety of methods can be employed.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting element.

Figure 9A:
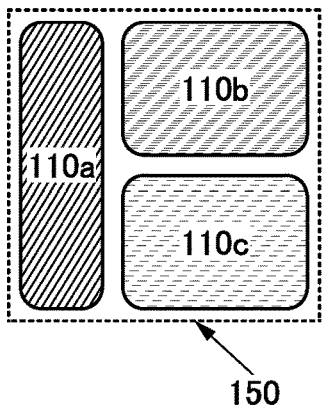
FIGS. 9A to 9F each illustrate a structure example of a pixel.

A pixel 150 illustrated in FIG. 9A employs S-stripe arrangement. The pixel 150 in FIG. 9A consists of three subpixels: light-emitting elements 110a, 110b, and 110c. For example, the light-emitting element 110a may be a blue-light-emitting element, the light-emitting element 110b may be a red-light-emitting element, and the light-emitting element 110c may be a green-light-emitting element.

Figure 9B:
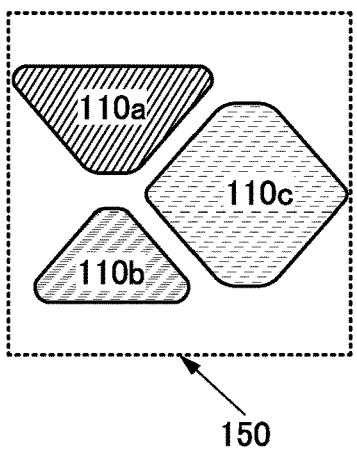

The pixel 150 illustrated in FIG. 9B includes the light-emitting element 110a whose top surface has a rough trapezoidal shape with rounded corners, the light-emitting element 110b whose top surface has a rough triangle shape with rounded corners, and the light-emitting element 110c whose top surface has a rough tetragonal or rough hexagonal shape with rounded corners. The light-emitting element 110a has a larger light-emitting area than the light-emitting element 110b. In this manner, the shapes and sizes of the light-emitting elements can be determined independently. For example, the size of a light-emitting element with higher reliability can be smaller. For example, the light-emitting element 110a may be a green-light-emitting element, the light-emitting element 110b may be a red-light-emitting element, and the light-emitting element 110c may be a blue-light-emitting element.

Figure 9C:
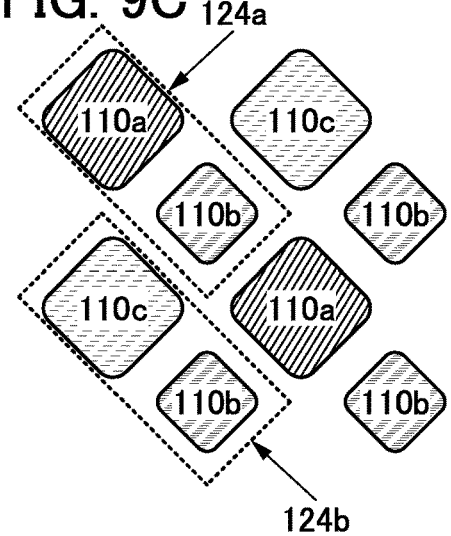

Pixels 124a and 124b illustrated in FIG. 9C employ PenTile arrangement. FIG. 9C illustrates an example in which the pixels 124a including the light-emitting elements 110a and 110b and the pixels 124b including the light-emitting elements 110b and 110c are alternately arranged. For example, the light-emitting element 110a may be a red-light-emitting element, the light-emitting element 110b may be a green-light-emitting element, and the light-emitting element 110c may be a blue-light-emitting element.

Figure 9D:
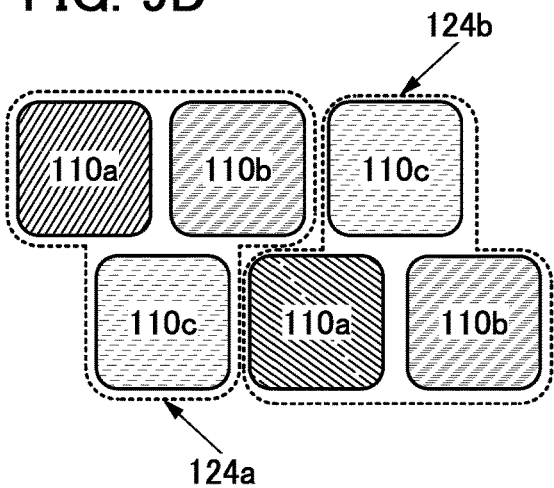
Figure 9E:
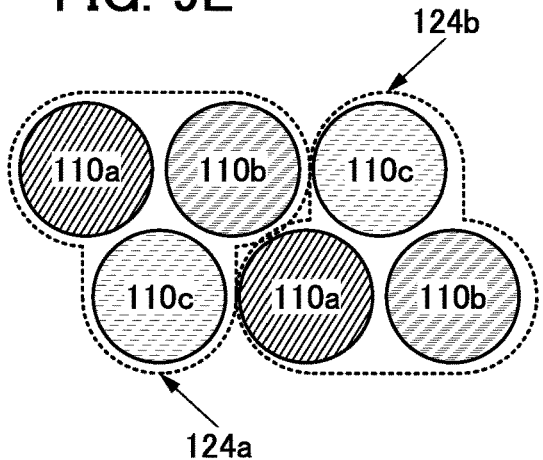

The pixels 124a and 124b illustrated in FIGS. 9D and 9E employ delta arrangement. The pixel 124a includes two light-emitting elements (the light-emitting elements 110a and 110b) in the upper row (first row) and one light-emitting element (the light-emitting element 110c) in the lower row (second row). The pixel 124b includes one light-emitting element (the light-emitting element 110c) in the upper row (first row) and two light-emitting elements (the light-emitting elements 110a and 110b) in the lower row (second row). For example, the light-emitting element 110a may be a red-light-emitting element, the light-emitting element 110b may be a green-light-emitting element, and the light-emitting element 110c may be a blue-light-emitting element.

FIG. 9D shows an example where the top surface of each light-emitting element has a rough tetragonal shape with rounded corners, and FIG. 9E shows an example where the top surface of each light-emitting element is circular.

Figure 9F:
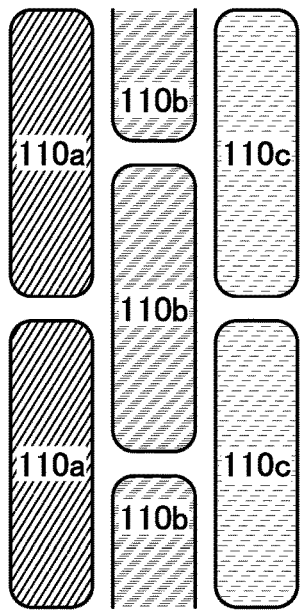

FIG. 9F shows an example where light-emitting elements of different colors are arranged in a zigzag manner. Specifically, the positions of the top sides of two light-emitting elements arranged in the column direction (e.g., the light-emitting element 110a and the light-emitting element 110b or the light-emitting element 110b and the light-emitting element 110c) are not aligned in the top view. For example, the light-emitting element 110a may be a red-light-emitting element, the light-emitting element 110b may be a green-light-emitting element, and the light-emitting element 110c may be a blue-light-emitting element.

In a photolithography method, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a light-emitting element may have a polygonal shape with rounded corners, an elliptical shape, a circular shape, or the like.

Furthermore, in the manufacturing method of the display device of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, a top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

The above is the description of the pixel layouts.

At least part of this embodiment can be implemented in combination with any of the other embodiments described in this specification, as appropriate.

Embodiment 2

In this embodiment, structure examples of a display device of one embodiment of the present invention will be described.

The display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400]

Figure 10:
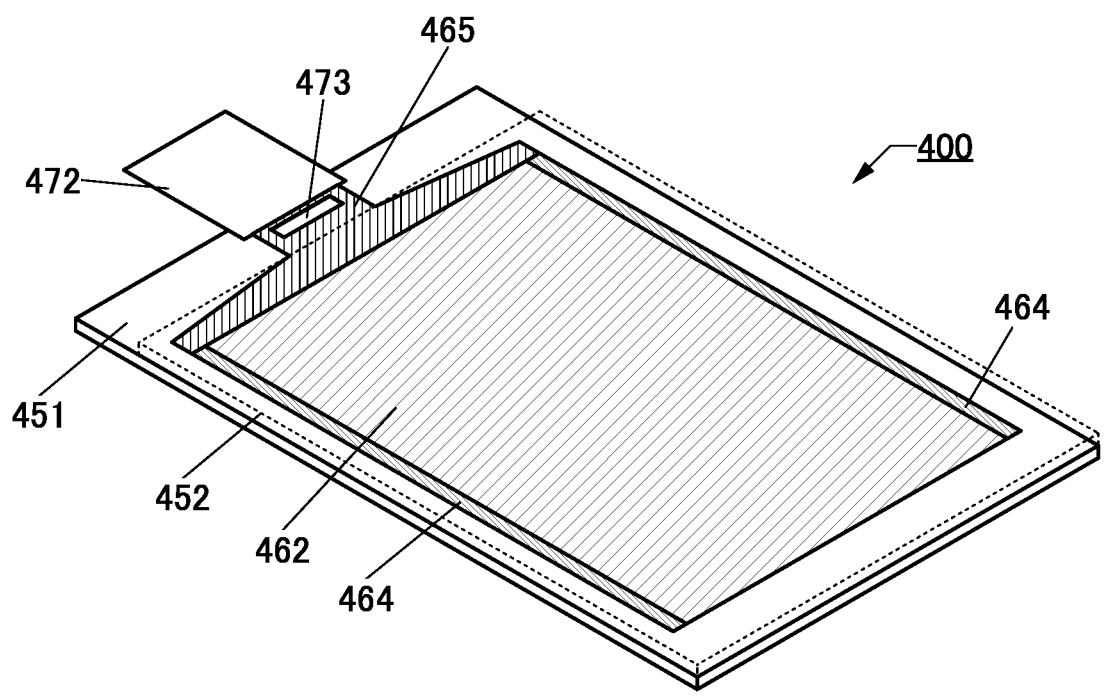
FIG. 10 illustrates a structure example of a display device.

FIG. 10 is a perspective view of a display device 400, and FIG. 11A is a cross-sectional view of the display device 400.

The display device 400 has a structure where a substrate 452 and a substrate 451 are bonded to each other. In FIG. 10, the substrate 452 is denoted by a dashed line.

The display device 400 includes a display portion 462, a circuit 464, a wiring 465, and the like. FIG. 10 illustrates an example in which an IC 473 and an FPC 472 are implemented on the display device 400. Thus, the structure illustrated in FIG. 10 can be regarded as a display module including the display device 400, the IC (integrated circuit), and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or from the IC 473.

FIG. 10 illustrates an example in which the IC 473 is provided over the substrate 451 by a chip on glass (COG) method, a chip on film (COF) method, or the like. An IC including a scan line driver circuit, a signal line driver circuit, or the like can be used as the IC 473, for example. Note that the display device 400 and the display module are not necessarily provided with an IC. The IC may be mounted on the FPC by a COF method or the like.

FIG. 11A illustrates an example of cross sections of part of a region including the FPC 472, part of the circuit 464, part of the display portion 462, and part of a region including a connection portion of the display device 400. FIG. 11A specifically illustrates an example of a cross section of a region including a light-emitting element 430b, which emits green light, and a light-emitting element 430c, which emits blue light, in the display portion 462.

The display device 400 illustrated in FIG. 11A includes a transistor 202, a transistor 210, the light-emitting element 430b, the light-emitting element 430c, and the like between a substrate 453 and a substrate 454.

The light-emitting element described in Embodiment 1 can be employed for the light-emitting element 430b and the light-emitting element 430c.

In the case where a pixel of the display device includes three kinds of subpixels including light-emitting elements emitting different colors from each other, the three subpixels can be of three colors of red (R), green (G), and blue (B) or of three colors of yellow (Y), cyan (C), and magenta (M). In the case where four subpixels are included, the four subpixels can be of four colors of R, G, B, and white (W) or of four colors of R, G, B, and Y.

The substrate 454 and a protective layer 416 are bonded to each other with an adhesive layer 442. The adhesive layer 442 is provided so as to overlap with the light-emitting element 430b and the light-emitting element 430c; that is, the display device 400 employs a solid sealing structure.

The light-emitting element 430b and the light-emitting element 430c each include a conductive layer 411a, a conductive layer 411b, and a conductive layer 411c as a pixel electrode. The conductive layer 411b reflects visible light and serves as a reflective electrode. The conductive layer 411c transmits visible light and serves as an optical adjustment layer.

The conductive layer 411a is connected to a conductive layer 222b included in the transistor 210 through an opening provided in an insulating layer 214. The transistor 210 has a function of controlling the driving of the light-emitting element.

An EL layer 412G or an EL layer 412B is provided to cover the pixel electrode. An insulating layer 421 is provided in contact with a side surface of the EL layer 412G and a side surface of the EL layer 412B, and a resin layer 422 is provided to fill a recessed portion of the insulating layer 421. A common layer 414, a common electrode 413, and the protective layer 416 are provided to cover the EL layer 412G and the EL layer 412B.

Light from the light-emitting element is emitted toward the substrate 454. For the substrate 454, a material having a high visible-light-transmitting property is preferably used.

The transistor 202 and the transistor 210 are formed over the substrate 453. These transistors can be fabricated using the same materials in the same steps.

The substrate 453 and an insulating layer 212 are bonded to each other with an adhesive layer 455.

As a method for manufacturing the display device 400, first, a formation substrate provided with the insulating layer 212, the transistors, the light-emitting elements, and the like is bonded to the substrate 454 with the adhesive layer 442. Then, the substrate 453 is bonded to a surface exposed by separation of the formation substrate, whereby the components formed over the formation substrate are transferred onto the substrate 453. The substrate 453 and the substrate 454 are preferably flexible. Accordingly, the display device 400 can be highly flexible.

The inorganic insulating film that can be used as an insulating layer 211 and an insulating layer 215 can be used as the insulating layer 212.

A connection portion 204 is provided in a region of the substrate 453 that is not overlapped by the substrate 454. In the connection portion 204, the wiring 465 is electrically connected to the FPC 472 through a conductive layer 466 and a connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include a conductive layer 221 functioning as a gate, the insulating layer 211 functioning as a gate insulating layer, a semiconductor layer 231 including a channel formation region 231i and a pair of low-resistance regions 231n, a conductive layer 222a connected to one of the low-resistance regions 231n, the conductive layer 222b connected to the other low-resistance region 231n, an insulating layer 225 functioning as a gate insulating layer, a conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layers 222a and 222b serves as a source, and the other serves as a drain.

FIG. 11A shows an example where the insulating layer 225 covers a top and side surfaces of the semiconductor layer. The conductive layer 222a and the conductive layer 222b are connected to the corresponding low-resistance regions 231n through openings provided in the insulating layer 225 and the insulating layer 215.

In a transistor 209 illustrated in FIG. 11B, the insulating layer 225 overlaps with the channel formation region 231i of the semiconductor layer 231 and does not overlap with the low-resistance regions 231n. The structure illustrated in FIG. 11B is obtained by processing the insulating layer 225 with the conductive layer 223 as a mask, for example. In FIG. 11B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 202 and 210. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used in the semiconductor layer of the transistor, and an amorphous semiconductor, a single crystal semiconductor, or a semiconductor having crystallinity other than single crystal (a microcrystalline semiconductor, a polycrystalline semiconductor, or a semiconductor partly including crystal regions) can be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment.

The band gap of a metal oxide included in the semiconductor layer of the transistor is preferably 2 eV or more, further preferably 2.5 eV or more. The use of such a metal oxide having a wide band gap can reduce the off-state current of the OS transistor.

A metal oxide preferably contains at least indium or zinc, and further preferably contains indium and zinc. A metal oxide preferably contains indium, M (M is one or more of gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example.

Alternatively, a semiconductor layer of a transistor may contain silicon. Examples of silicon include amorphous silicon and crystalline silicon (e.g., low-temperature polysilicon or single crystal silicon).

The transistor included in the circuit 464 and the transistor included in the display portion 462 may have the same structure or different structures. One structure or two or more kinds of structures may be employed for a plurality of transistors included in the circuit 464. Similarly, one structure or two or more kinds of structures may be employed for a plurality of transistors included in the display portion 462.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used as each of the insulating layers 211, 212, 215, 218, and 225. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

A variety of optical members can be arranged on the inner or outer surface of the substrate 454. Examples of the optical members include a light-blocking layer, a polarizing plate, a retardation plate, a light diffusion layer (e.g., a diffusion film), an anti-reflective layer, a microlens array, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 454.

When the protective layer 416 covering the light-emitting element is provided, which inhibits an impurity such as water from entering the light-emitting element. As a result, the reliability of the light-emitting element can be enhanced.

FIG. 11A illustrates a connection portion 228. In the connection portion 228, the common electrode 413 is electrically connected to a wiring. FIG. 11A illustrates an example in which the wiring has the same stacked-layer structure as the pixel electrode.

For each of the substrates 453 and 454, glass, quartz, ceramic, sapphire, a resin, a metal, an alloy, a semiconductor, or the like can be used. The substrate on the side from which light from the light-emitting element is extracted is formed using a material that transmits the light.

When the substrates 453 and 454 are formed using a flexible material, the flexibility of the display device can be increased. Furthermore, a polarizing plate may be used as the substrate 453 or the substrate 454.

For each of the substrates 453 and 454, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrates 453 and 454.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers functioning as wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

At least part of this embodiment can be implemented in combination with any of the other embodiments described in this specification, as appropriate.

Embodiment 3

In this embodiment, the display panel of one embodiment of the present invention will be described with reference to drawings.

The display panel of this embodiment can be a high-resolution display panel. Thus, the display device of one embodiment of the present invention can be used for display portions of information terminals (wearable devices) such as watch-type or bracelet-type information terminals and display portions of wearable devices capable of being worn on a head, such as a VR device such as a head-mounted display and a glasses-type AR device.

[Display Module]

Figure 12A:
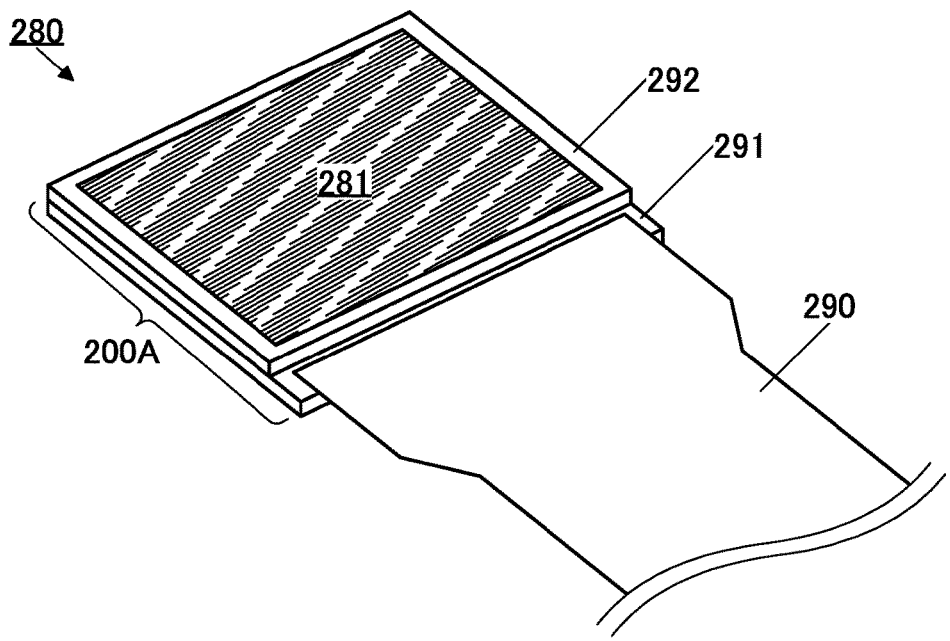
FIGS. 12A and 12B illustrate a structure example of a display device.

FIG. 12A is a perspective view of a display module 280. The display module 280 includes a display device 200A and an FPC 290. Note that a display panel included in the display module 280 is not limited to the display device 200A, and may be any of display devices 200B to 200F, which are described later.

The display module 280 includes a substrate 291 and a substrate 292. The display module 280 includes a display portion 281. The display portion 281 is a region where an image is displayed.

Figure 12B:
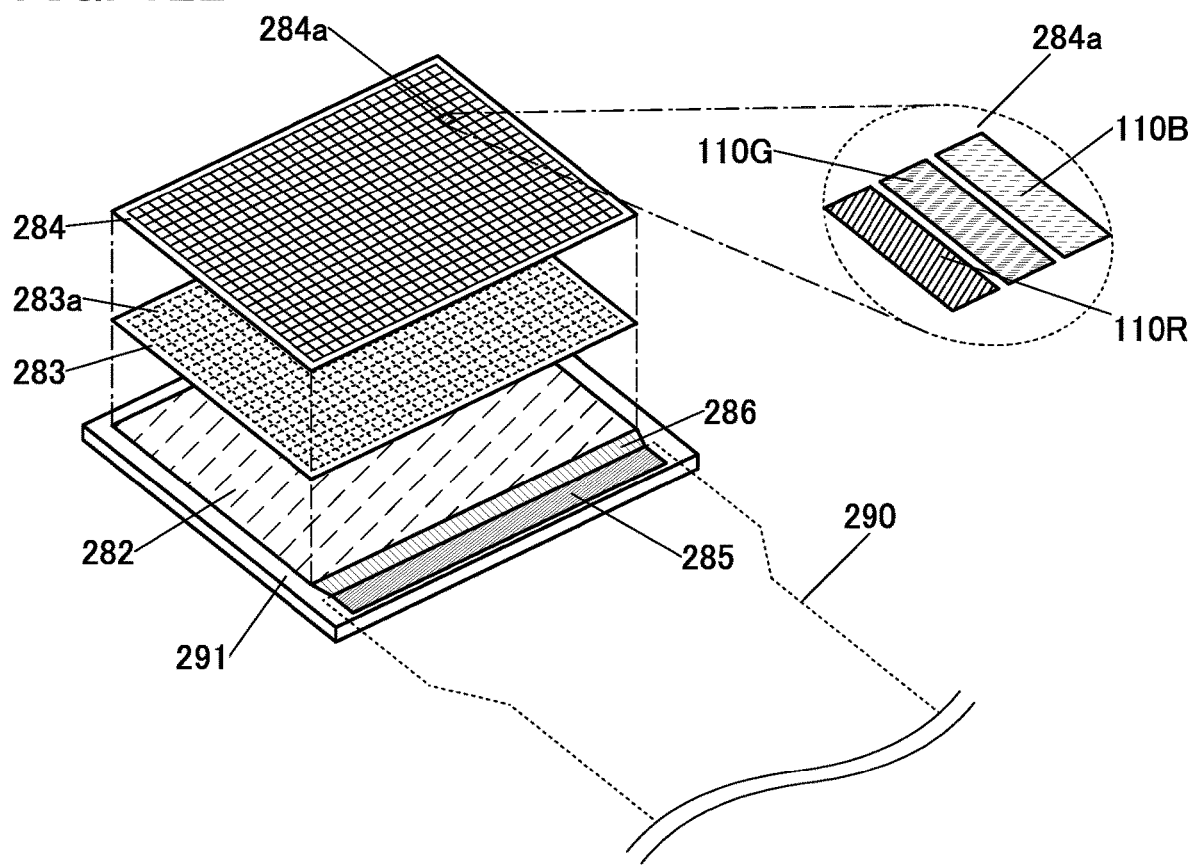

FIG. 12B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 12B. The pixel 284a includes the light-emitting element 110R emitting red light, the light-emitting element 110G emitting green light, and the light-emitting element 110B emitting blue light.

The pixel circuit portion 283 includes a plurality of pixel circuits 283a arranged periodically. One pixel circuit 283a is a circuit that controls light emission from three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. In this case, a gate signal is input to a gate of the selection transistor, and a source signal is input to a source of the selection transistor. Thus, an active-matrix display panel is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included. A transistor included in the circuit portion 282 may constitute part of the pixel circuit 283a. That is, the pixel circuit 283a may be constituted by a transistor included in the pixel circuit portion 283 and a transistor included in the circuit portion 282.

The FPC 290 serves as a wiring for supplying a video signal, a power supply potential, and the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have greatly high resolution. For example, the pixels 284a are preferably arranged in the display portion 281 with a resolution greater than or equal to 2000 ppi, preferably greater than or equal to 3000 ppi, further preferably greater than or equal to 5000 ppi, and still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 200A]

Figure 13:
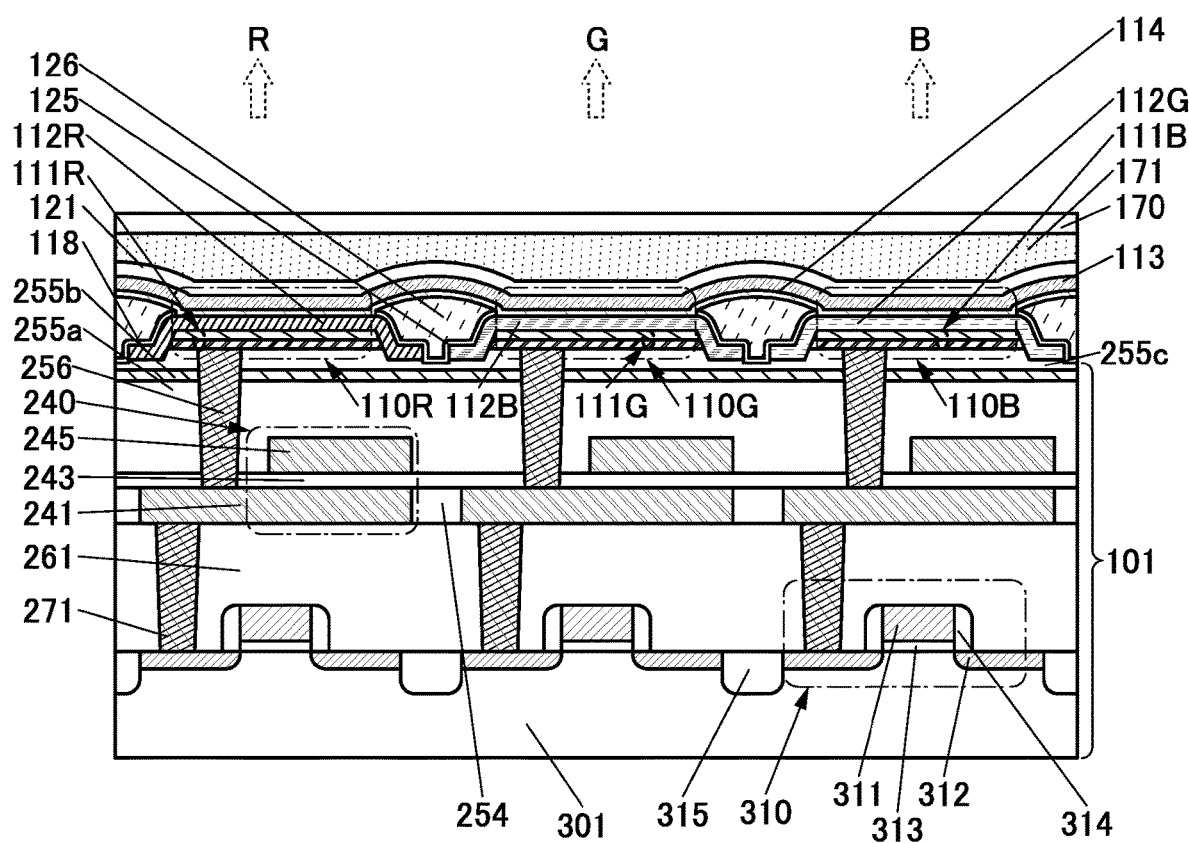
FIG. 13 illustrates a structure example of a display device.

The display device 200A illustrated in FIG. 13 includes a substrate 301, the light-emitting elements 110R, 110G, and 110B, a capacitor 240, and a transistor 310.

The substrate 301 corresponds to the substrate 291 in FIGS. 12A and 12B.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311.

An element isolation layer 315 is provided between two adjacent transistors 310 so as to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255a is provided to cover the capacitor 240; an insulating layer 255b is provided over the insulating layer 255a; and an insulating layer 255c is provided over the insulating layer 255b.

An inorganic insulating film can be suitably used as each of the insulating layers 255a, 255b, and 255c. For example, it is preferable that a silicon oxide film be used as the insulating layers 255a and 255c and a silicon nitride film be used as the insulating layer 255b. This enables the insulating layer 255b to function as an etching protective film Although this embodiment shows an example in which part of the insulating layer 255c is etched to form a recessed portion, the recessed portion is not necessarily provided in the insulating layer 255c.

The light-emitting element 110R, the light-emitting element 110G, and the light-emitting element 110B are provided over the insulating layer 255c. Embodiment 1 can be referred to for the structures of the light-emitting element 110R, the light-emitting element 110G, and the light-emitting element 110B. A stacked structure including the substrate 301 and the components thereover up to the insulating layer 255c corresponds to the substrate 101 in Embodiment 1.

In the display device 200A, since the light-emitting elements of different colors are separately formed, the difference between the chromaticity at low luminance emission and that at high luminance emission is small. Furthermore, since the EL layers 112R, 112G, and 112B are separated from each other, crosstalk generated between adjacent subpixels can be prevented while the display device 200A has high resolution. Accordingly, the display panel can have high resolution and high display quality.

In the region between adjacent light-emitting elements, the insulating layer 125 and the resin layer 126 are provided.

The pixel electrodes 111R, 111G, and 111B of the light-emitting elements are each electrically connected to one of the source and the drain of the transistor 310 through a plug 256 embedded in the insulating layers 255a, 255b, and 255c, the conductive layer 241 embedded in the insulating layer 254, and the plug 271 embedded in the insulating layer 261. A top surface of the insulating layer 255c and a top surface of the plug 256 are level with or substantially level with each other. Any of a variety of conductive materials can be used for the plugs.

The protective layer 121 is provided over the light-emitting elements 110R, 110G, and 110B. A substrate 170 is bonded above the protective layer 121 with an adhesive layer 171.

An insulating layer covering an end portion of a top end portion of the pixel electrode 111 is not provided between two adjacent pixel electrodes 111. Thus, the interval between adjacent light-emitting elements can be extremely shortened. Accordingly, the display device can have high resolution or high definition.

[Display Device 200B]

Figure 14:
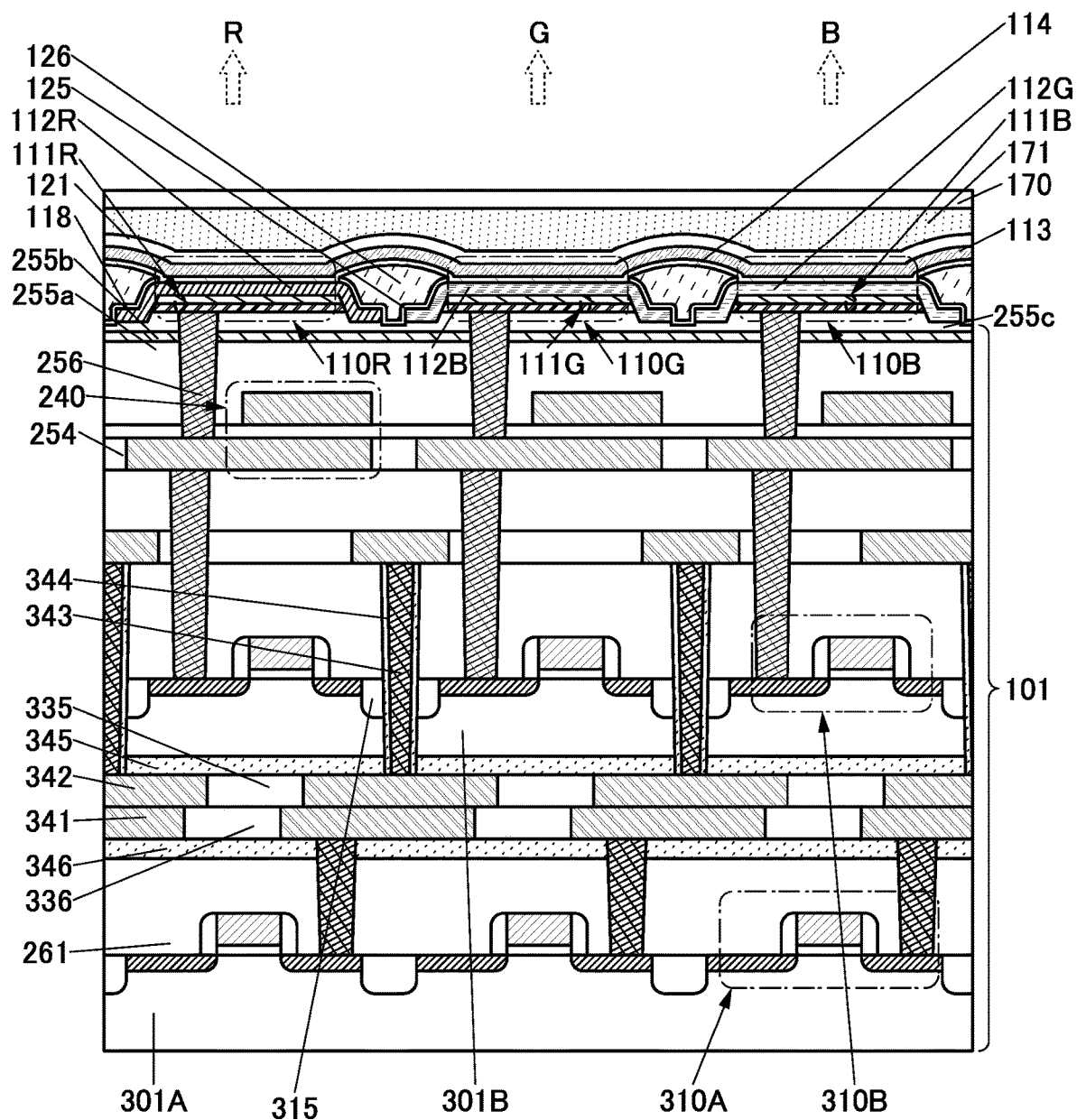
FIG. 14 illustrates a structure example of a display device.

The display device 200B illustrated in FIG. 14 has a structure in which a transistor 310A and a transistor 310B each having a channel formed in a semiconductor substrate are stacked. Note that in the following description of display panels, the description of portions similar to those of the above-described display panel may be omitted.

In the display device 200B, a substrate 301B provided with the transistor 310B, the capacitor 240, and the light-emitting elements is bonded to a substrate 301A provided with the transistor 310A.

Here, an insulating layer 345 is provided on a bottom surface of the substrate 301B. An insulating layer 346 is provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 121 or an insulating layer 332 can be used.

The substrate 301B is provided with a plug 343 that penetrates the substrate 301B and the insulating layer 345. An insulating layer 344 functioning as a protective layer is preferably provided to cover a side surface of the plug 343.

A conductive layer 342 is provided under the insulating layer 345 on the rear surface of the substrate 301B. The conductive layer 342 is embedded in the insulating layer 335. Bottom surfaces of the conductive layer 342 and the insulating layer 335 are planarized. The conductive layer 342 is electrically connected to the plug 343.

A conductive layer 341 is provided over the insulating layer 346 over the substrate 301A. The conductive layer 341 is embedded in the insulating layer 336. Top surfaces of the conductive layer 341 and the insulating layer 336 are planarized.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Device 200C]

Figure 15:
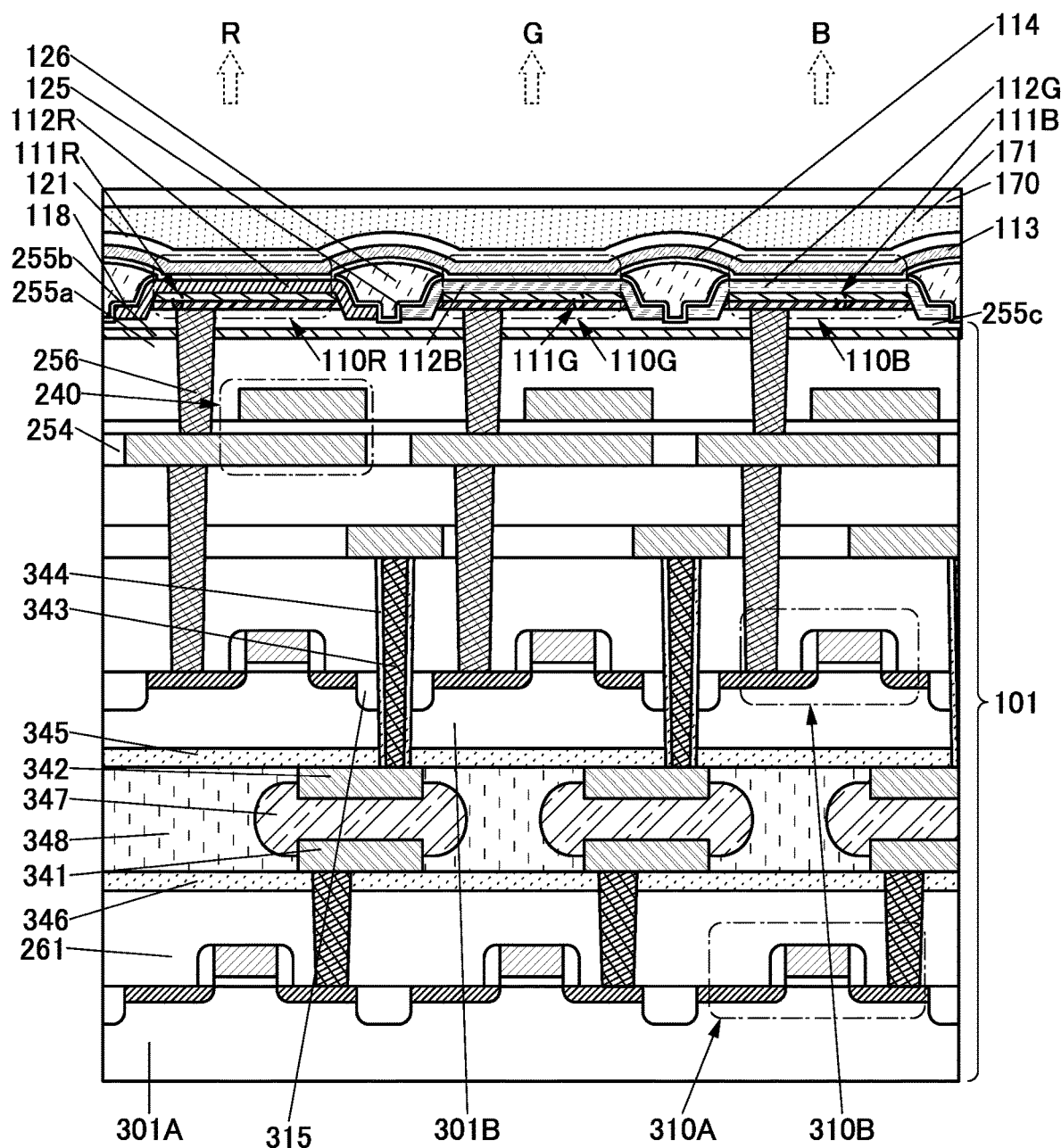
FIG. 15 illustrates a structure example of a display device.

The display device 200C illustrated in FIG. 15 has a structure in which the conductive layer 341 and the conductive layer 342 are bonded to each other with a bump 347.

As illustrated in FIG. 15, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 200D]

Figure 16:
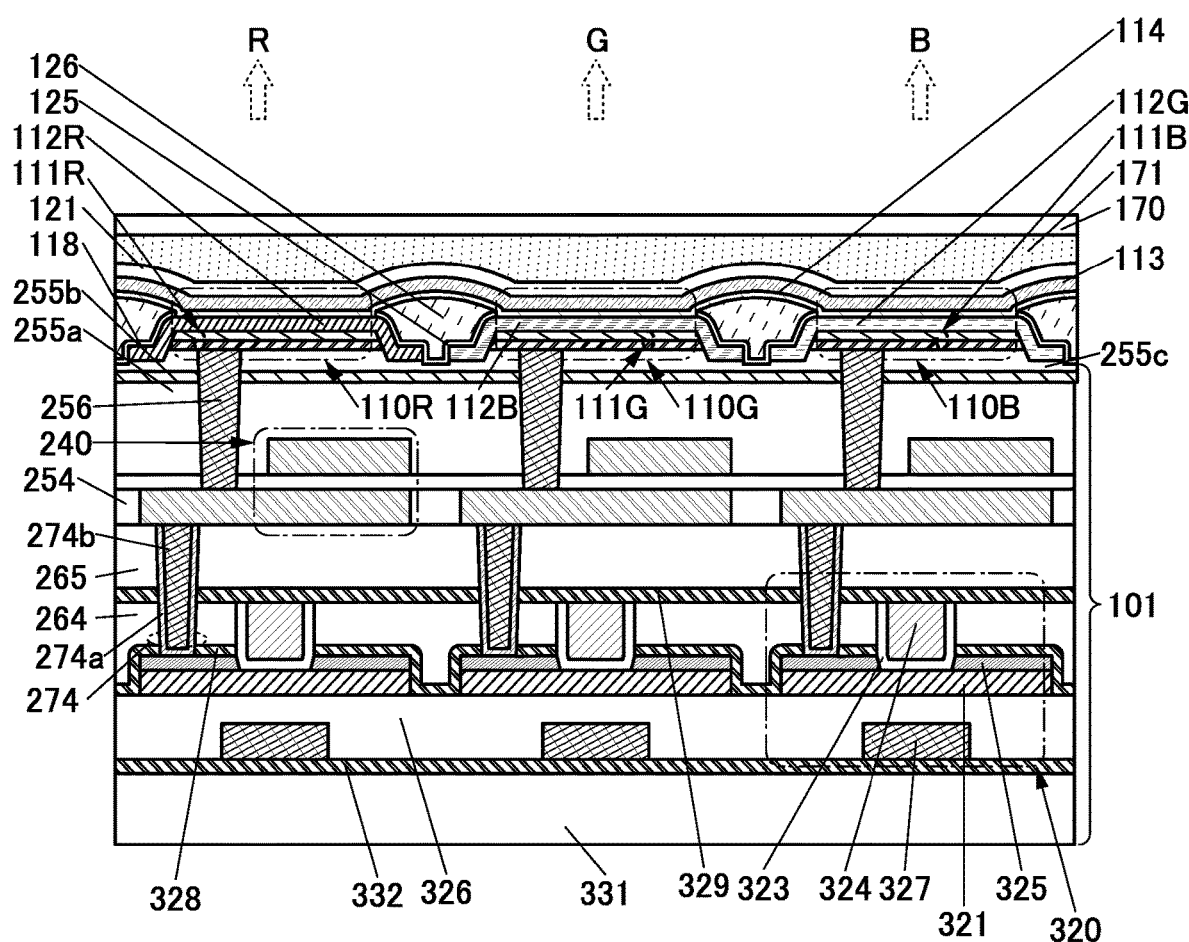
FIG. 16 illustrates a structure example of a display device.

The display device 200D illustrated in FIG. 16 differs from the display device 200A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIGS. 12A and 12B.

The insulating layer 332 is provided over the substrate 331. The insulating layer 332 functions as a barrier layer that prevents diffusion of an impurity such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. A top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 are provided on and in contact with the semiconductor layer 321, and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of an impurity such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with a top surface of the semiconductor layer 321 and the conductive layer 324 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are planarized so that they are level with or substantially level with each other, and an insulating layer 329 and an insulating layer 265 are provided to cover these layers.

The insulating layers 264 and 265 each function as an interlayer insulating layer. The insulating layer 329 functions as a barrier layer that prevents diffusion of an impurity such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers a side surface of an opening formed in the insulating layers 265, 329, 264, and 328 and part of the top surface of the conductive layer 325, and a conductive layer 274b in contact with a top surface of the conductive layer 274a. For the conductive layer 274a, a conductive material in which hydrogen and oxygen are less likely to diffuse is preferably used.

[Display Device 200E]

Figure 17:
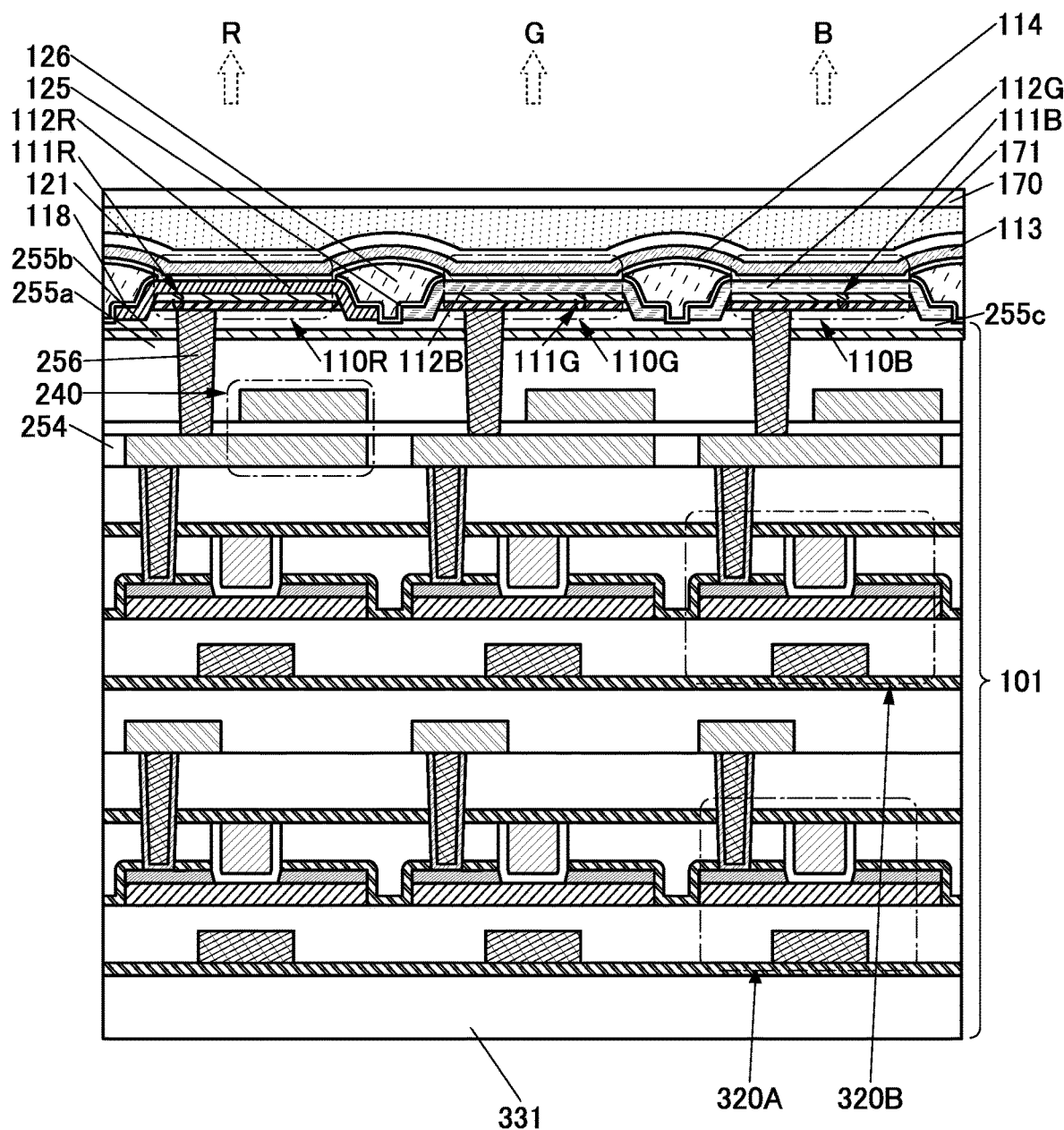
FIG. 17 illustrates a structure example of a display device.

The display device 200E illustrated in FIG. 17 has a structure in which a transistor 320A and a transistor 320B each including an oxide semiconductor in a semiconductor where a channel is formed are stacked.

The description of the display device 200D can be referred to for the transistor 320A, the transistor 320B, and the components around them.

Although the structure in which two transistors each including an oxide semiconductor are stacked is described, one embodiment of the present invention is not limited thereto. For example, three or more transistors may be stacked.

[Display Device 200F]

Figure 18:
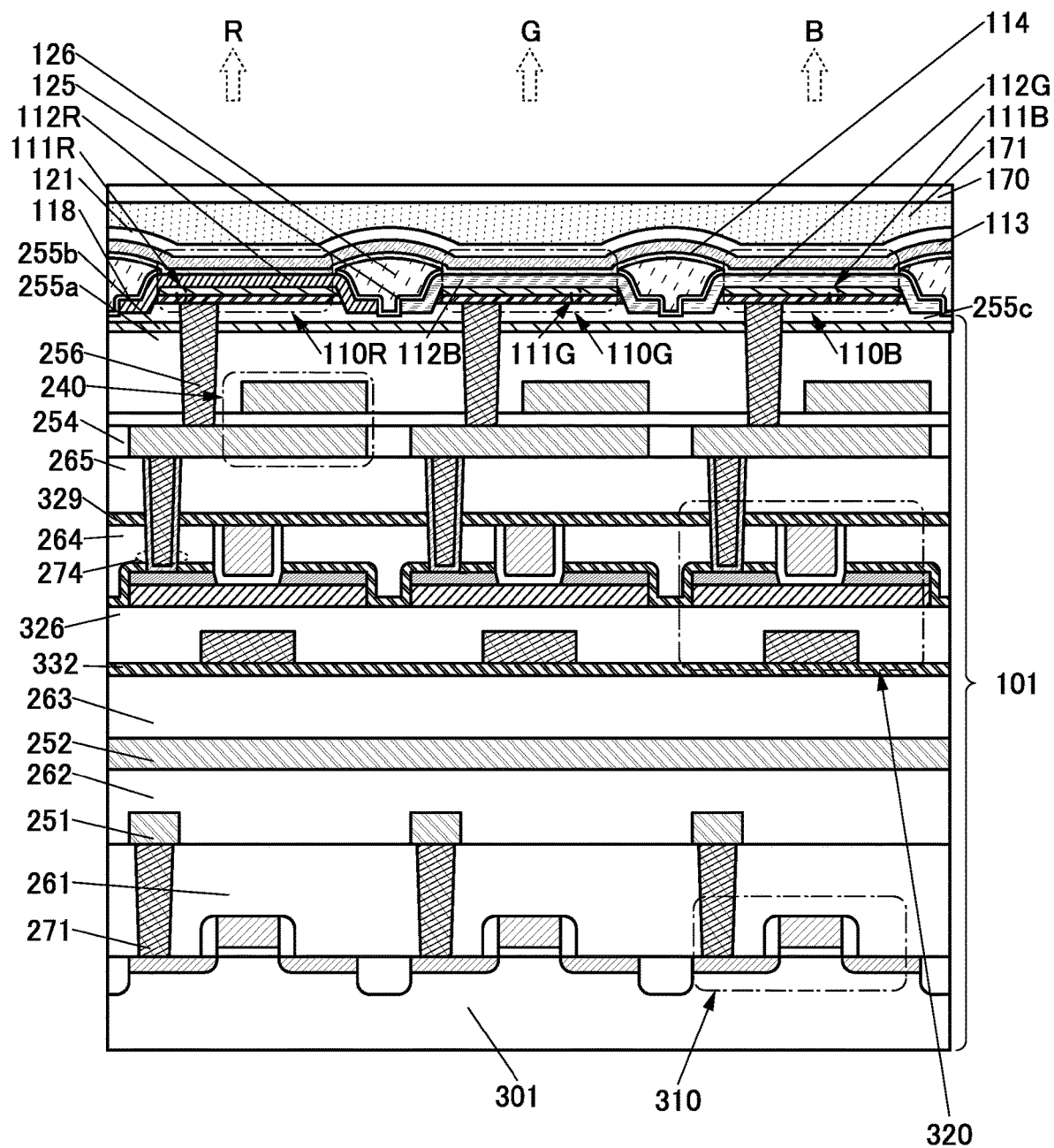
FIG. 18 illustrates a structure example of a display device.

The display device 200F illustrated in FIG. 18 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display panel can be downsized as compared with the case where a driver circuit is provided around a display region.

At least part of this embodiment can be implemented in combination with any of the other embodiments described in this specification, as appropriate.

Embodiment 4

In this embodiment, a light-emitting element (also referred to as light-emitting device) that can be used in the display device of one embodiment of the present invention will be described.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a combination of white light-emitting devices with coloring layers (e.g., color filters) enables a full-color display device.

[Light-Emitting Device]

Structures of light-emitting devices can be classified roughly into a single structure and a tandem structure. A light-emitting device having a single structure includes one light-emitting unit between a pair of electrodes. The light-emitting unit includes one or more light-emitting layers. To obtain white light emission with a single structure, two or more light-emitting layers are selected such that emission of the light-emitting layers can produce an achromatic color (e.g., white). For example, in the case of two colors, when emission colors of a first light-emitting layer and a second light-emitting layer are complementary colors, the light-emitting device can be configured to emit white light as a whole.

A light-emitting device having a tandem structure includes a plurality of light-emitting units between a pair of electrodes. Each light-emitting unit includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In the light-emitting device with a tandem structure, it is preferable that an intermediate layer such as a charge-generation layer be provided between the plurality of light-emitting units.

When the white light-emitting device and a light-emitting device with a SBS structure are compared to each other, the latter can have lower power consumption than the former. Meanwhile, the white light-emitting device is preferable in terms of lower manufacturing cost and higher manufacturing yield because the manufacturing process of the white light-emitting device is simpler than that of the light-emitting device with the SBS structure.

<Structure Example of Light-Emitting Device>

Figure 19A:
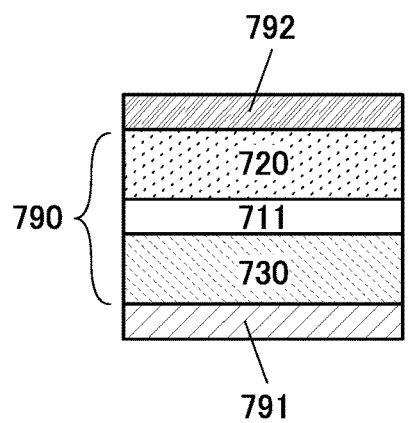
FIGS. 19A to 19F each illustrate a structure example of a light-emitting device.

As illustrated in FIG. 19A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 19A is referred to as a single structure in this specification.

Figure 19B:
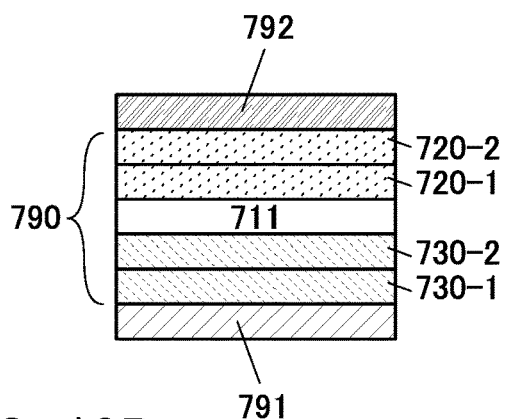

Specifically, the light-emitting device illustrated in FIG. 19B includes, over the lower electrode 791, a layer 730-1, a layer 730-2, the light-emitting layer 711, a layer 720-1, a layer 720-2, and the upper electrode 792. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. When the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as the hole-injection layer. With such a layered structure, carriers can be efficiently injected to the light-emitting layer 711, and the efficiency of the recombination of carriers in the light-emitting layer 711 can be enhanced.

Figure 19C:
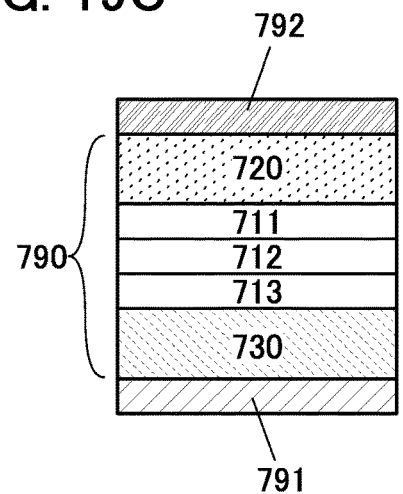
Figure 19D:
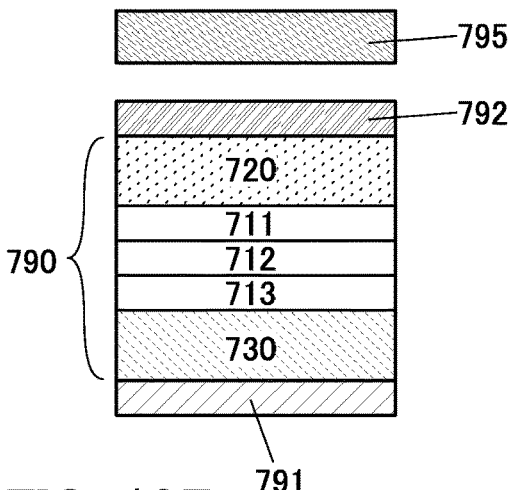

Note that structures in which a plurality of light-emitting layers (light-emitting layers 711, 712, and 713) are provided between the layer 720 and the layer 730 as illustrated in FIGS. 19C and 19D are other variations of the single structure.

Figure 19E:
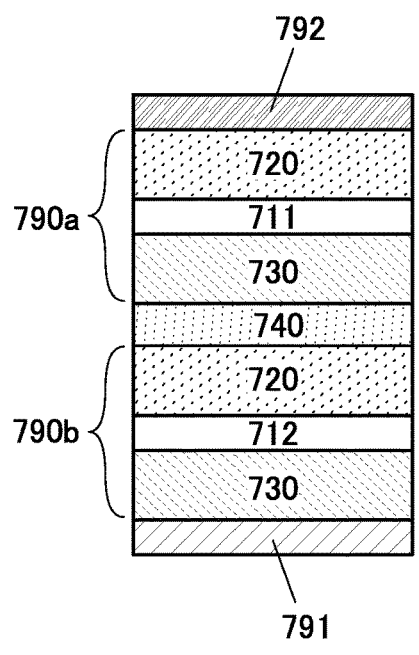
Figure 19F:
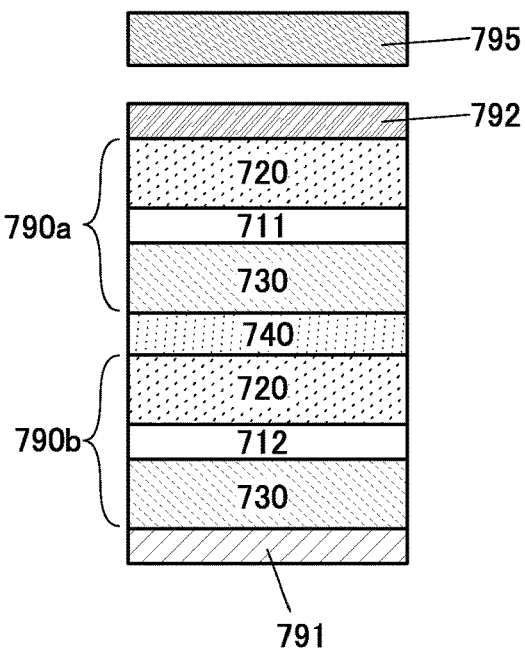

Structures in which a plurality of light-emitting units (EL layers 790a and 790b) are connected in series with an intermediate layer (charge-generation layer) 740 therebetween as illustrated in FIGS. 19E and 19F are referred to as a tandem structure in this specification. A tandem structure may be referred to as a stack structure. The tandem structure enables a light-emitting device capable of high luminance light emission.

In FIG. 19C, light-emitting materials that emit light of the same color, or moreover, the same light-emitting material may be used for the light-emitting layer 711, the light-emitting layer 712, and the light-emitting layer 713. The stacked light-emitting layers can increase emission luminance.

Alternatively, different light-emitting materials may be used for the light-emitting layer 711, the light-emitting layer 712, and the light-emitting layer 713. White light can be obtained when the light-emitting layer 711, the light-emitting layer 712, and the light-emitting layer 713 emit light of complementary colors. FIG. 19D shows an example in which a coloring layer 795 functioning as a color filter is provided. When white light passes through a color filter, light of a desired color can be obtained.

In FIG. 19E, light-emitting materials that emit light of the same color may be used for the light-emitting layer 711 and the light-emitting layer 712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 19F shows an example in which the coloring layer 795 is further provided.

In FIGS. 19C to 19F, the layer 720 and the layer 730 may each have a layered structure of two or more layers as in FIG. 19B.

In FIG. 19D, light-emitting materials that emit light of the same color may be used for the light-emitting layer 711, the light-emitting layer 712, and the light-emitting layer 713. Similarly, in FIG. 19F, light-emitting materials that emit light of the same color may be used for the light-emitting layer 711 and the light-emitting layer 712. Here, when a color conversion layer is used instead of the coloring layer 795, light of a desired color different from the emission color of the light-emitting material can be obtained. For example, a blue light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

The emission color of the light-emitting device can be changed to red, green, blue, cyan, magenta, yellow, white, or the like depending on the material of the EL layer 790. When the light-emitting device has a microcavity structure, the color purity can be further increased.

The light-emitting device that emits white light may have a structure in which a light-emitting layer contains two or more kinds of light-emitting substances, or two or more light-emitting layers containing different light-emitting substances are stacked. In that case, the light-emitting substances are preferably selected such that the light-emitting substances emit light of complementary colors.

[Light-Emitting Device]

Here, a specific structure example of a light-emitting device will be described.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-injection property, a substance with a high electron-transport property, an electron-blocking material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material.

The hole-transport material preferably has a hole mobility higher than or equal to $1 \times 10^{-6}$ cm$^2$/Vs. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility higher than or equal to $1×10^{-6}$ cm$^2$/Vs. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to -3.6 eV and less than or equal to -2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a: 2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Embodiment 5

In this embodiment, electronic devices of one embodiment of the present invention will be described with reference to FIGS. 20A to 20D, FIGS. 21A to 21F, and FIGS. 22A to 22G.

Electronic devices in this embodiment are each provided with the display panel (display device) of one embodiment of the present invention in a display portion. The display panel of one embodiment of the present invention can be easily increased in resolution and definition and can achieve high display quality. Thus, the display panel of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display panel of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably higher than or equal to 100 ppi, further preferably higher than or equal to 300 ppi, further preferably higher than or equal to 500 ppi, further preferably higher than or equal to 1000 ppi, further preferably higher than or equal to 2000 ppi, further preferably higher than or equal to 3000 ppi, still further preferably higher than or equal to 5000 ppi, and yet further preferably higher than or equal to 7000 ppi. The use of the display panel having one or both of such high definition and high resolution can further increase realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 20A to 20D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to feel a higher level of immersion.

Figure 20A:
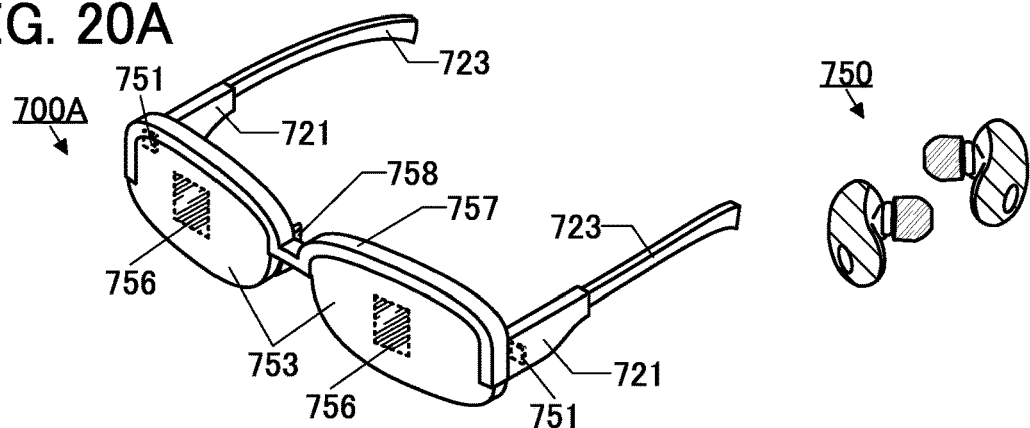
FIGS. 20A to 20D each illustrate a structure example of an electronic device.
Figure 20B:
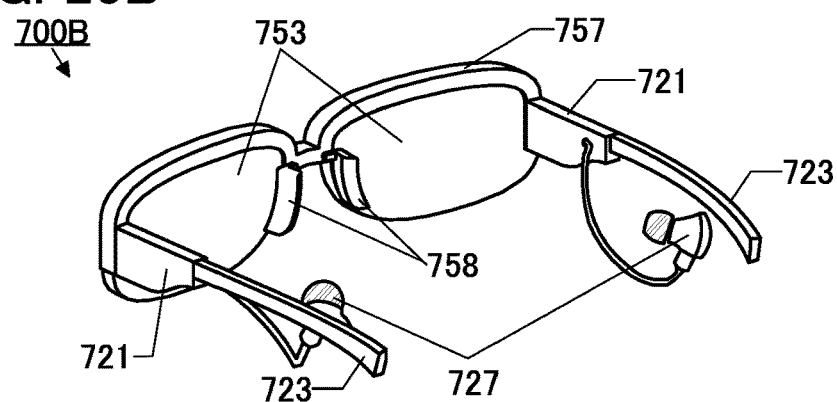

An electronic device 700A illustrated in FIG. 20A and an electronic device 700B illustrated in FIG. 20B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used in the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 20C:
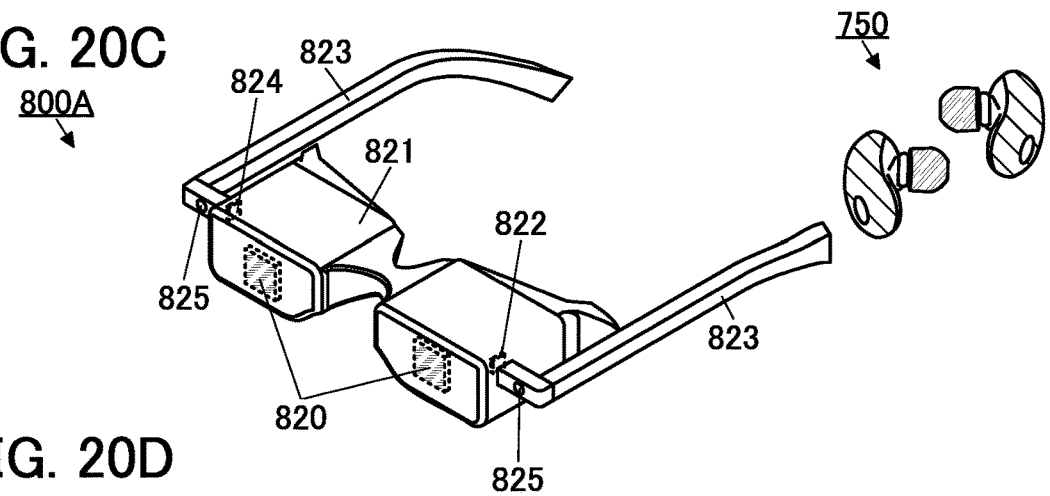
Figure 20D:
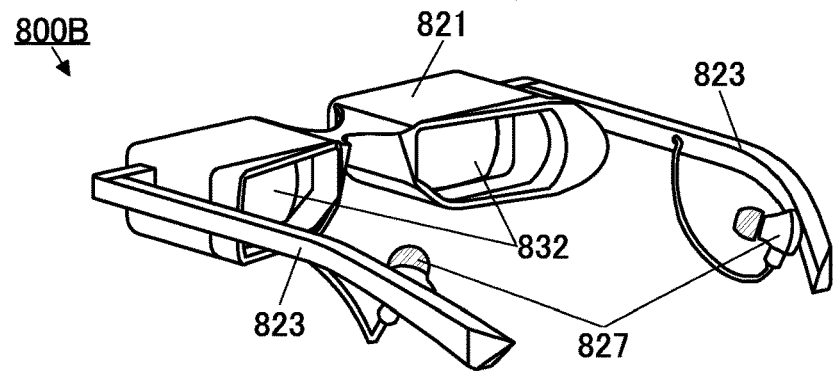

An electronic device 800A illustrated in FIG. 20C and an electronic device 800B illustrated in FIG. 20D each include a pair of display portions 820, a housing 821, a communication portion 822, a pair of wearing portions 823, a control portion 824, a pair of image capturing portions 825, and a pair of lenses 832.

The display panel of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 20C and the like show examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 20A has a function of transmitting information to the earphones 750 with the wireless communication function. For another example, the electronic device 800A in FIG. 20C has a function of transmitting information to the earphones 750 with the wireless communication function.

The electronic device may include an earphone portion. The electronic device 700B in FIG. 20B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 20D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

Figure 21A:
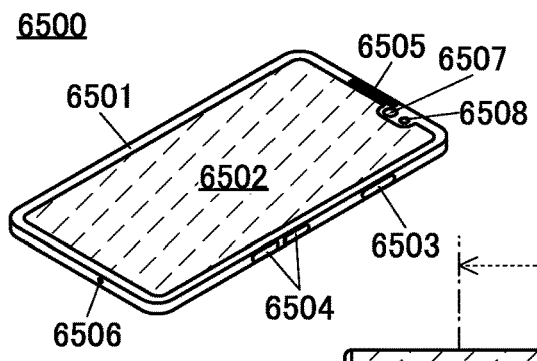
FIGS. 21A to 21F each illustrate a structure example of an electronic device.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used in the display portion 6502.

Figure 21B:
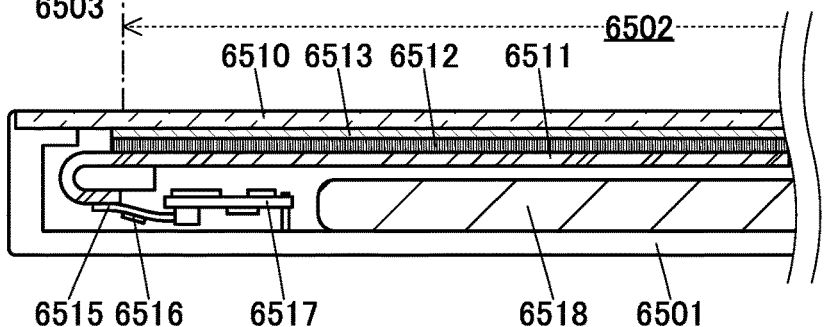

FIG. 21B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 21C:
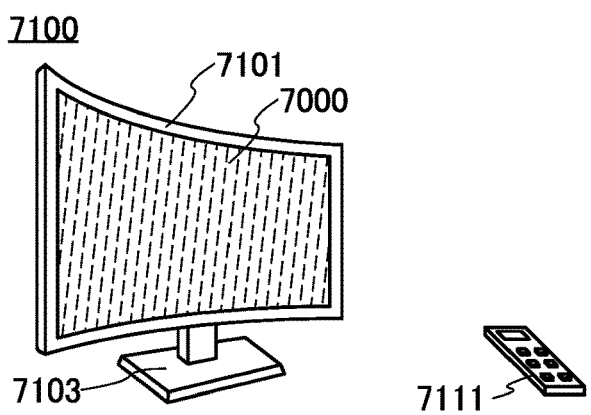

FIG. 21C illustrates an example of a television device. In a television device 7100, a display portion 7000 is incorporated in a housing 7101. Here, the housing 7101 is supported by a stand 7103.

Operation of the television device 7100 illustrated in FIG. 21C can be performed with an operation switch provided in the housing 7101 and a separate remote controller 7111.

Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 21D:
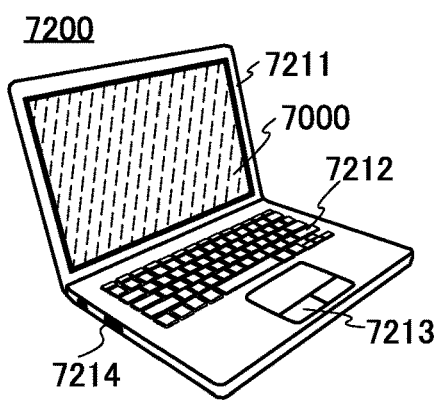

FIG. 21D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

Figure 21E:
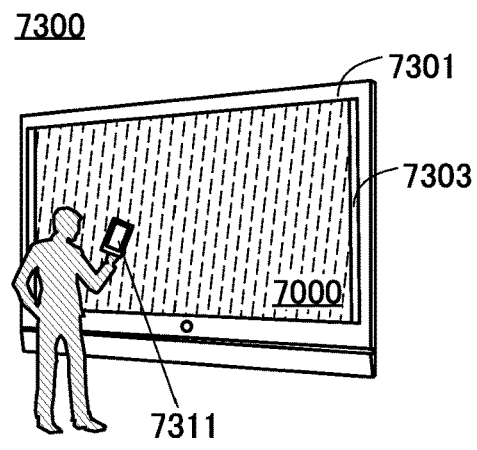
Figure 21F:
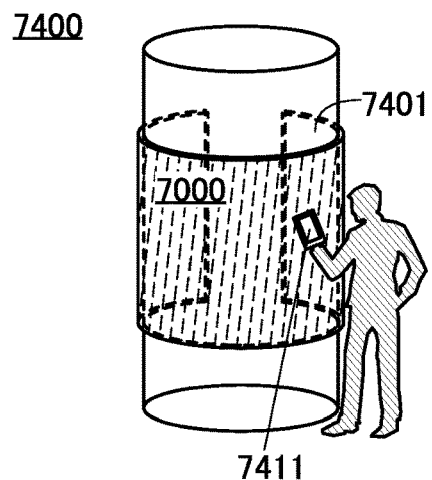

FIGS. 21E and 21F illustrate examples of digital signage.

Digital signage 7300 illustrated in FIG. 21E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 21F shows digital signage 7400 attached to a cylindrical pillar 7401. The digital signage 7400 includes the display portion 7000 provided along a curved surface of the pillar 7401.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 21E and 21F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

The display panel of one embodiment of the present invention can be used in the display portion 7000 illustrated in each of FIGS. 21C to 21F.

Electronic devices illustrated in FIGS. 22A to 22G each include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 22A to 22G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 22A to 22G are be described in detail below.

Figure 22A:
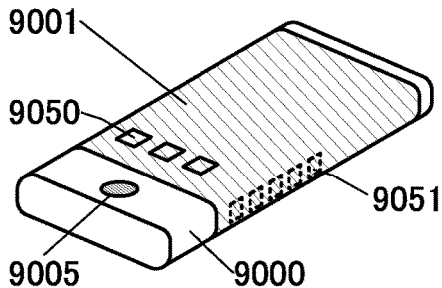
FIGS. 22A to 22G each illustrate a structure example of an electronic device.

FIG. 22A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 22A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 22B:
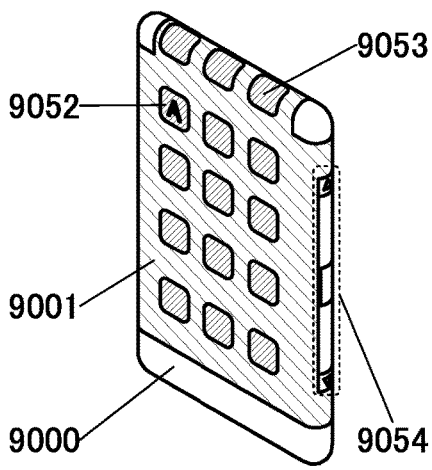

FIG. 22B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 22C:
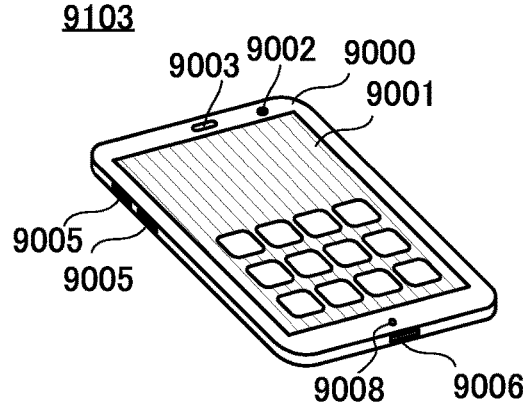

FIG. 22C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 22D:
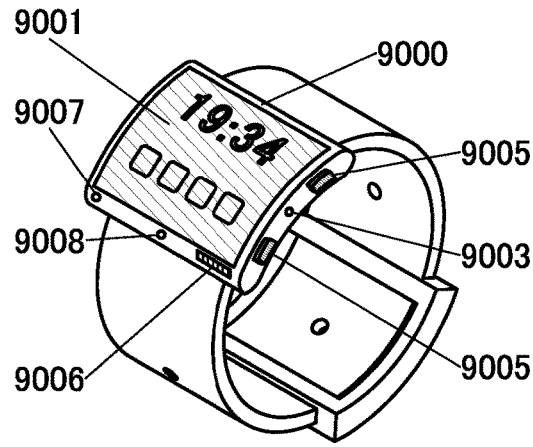

FIG. 22D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 22E:
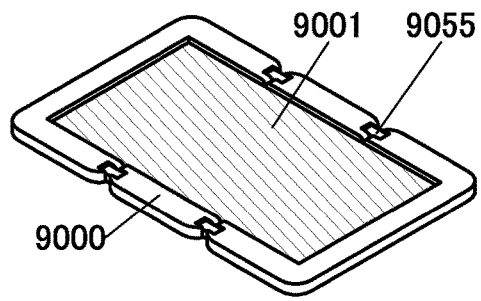
Figure 22F:
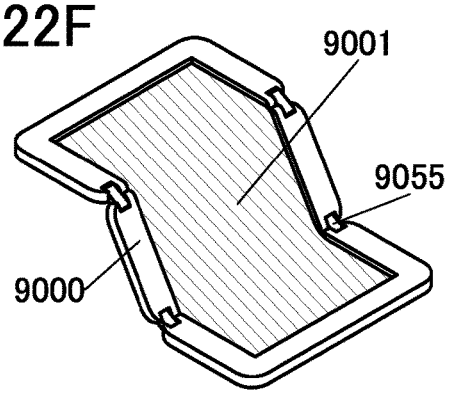
Figure 22G:
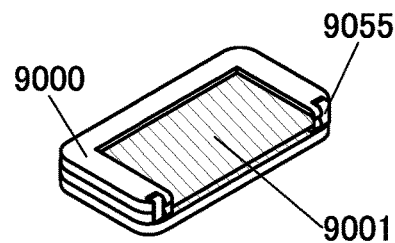

FIGS. 22E to 22G are perspective views of a foldable portable information terminal 9201. FIG. 22E is a perspective view showing the portable information terminal 9201 that is opened. FIG. 22G is a perspective view showing the portable information terminal 9201 that is folded. FIG. 22F is a perspective view showing the portable information terminal 9201 that is shifted from one of the states in FIGS. 22E and 22G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

At least part of this embodiment can be implemented in combination with any of the other embodiments described in this specification, as appropriate.

This application is based on Japanese Patent Application Serial No. 2021-108371 filed with Japan Patent Office on Jun. 30, 2021, the entire contents of which are hereby incorporated by reference.

What is claimed is:

1. A manufacturing method of a display device, comprising:
    a first step of forming a first pixel electrode and a second pixel electrode each having a tapered shape;
    a second step of depositing a first EL film over and in contact with a top surface and a side surface of each of the first pixel electrode and the second pixel electrode;
    a third step of forming a first sacrificial film to cover the first EL film;
    a fourth step of processing the first sacrificial film and the first EL film to expose the second pixel electrode and form a first EL layer over the first pixel electrode and a first sacrificial layer over the first EL layer;
    a fifth step of depositing a second EL film over the first sacrificial layer and the second pixel electrode;
    a sixth step of forming a second sacrificial film to cover the second EL film;
    a seventh step of processing the second sacrificial film and the second EL film to expose the first sacrificial layer and form a second EL layer over the second pixel electrode and a second sacrificial layer over the second EL layer;
    an eighth step of removing the first sacrificial layer and the second sacrificial layer; and
    a ninth step of drying the first EL layer and the second EL layer,
    wherein in the fourth step, the first EL film and the first sacrificial film are processed by dry etching,
    wherein in the seventh step, the second EL film and the second sacrificial film are processed by dry etching, and
    wherein in the eighth step, the first sacrificial layer and the second sacrificial layer are removed by wet etching.

2. The manufacturing method of a display device, according to claim 1,
    wherein the first sacrificial film contains a resin material soluble in water or alcohol,
    wherein in the fourth step, the first sacrificial film and the first EL film are processed in succession by dry etching in an atmosphere containing oxygen, and
    wherein in the eighth step, the first sacrificial layer and the second sacrificial layer are removed by being dissolved in water or alcohol.

3. The manufacturing method of a display device, according to claim 1,
    wherein the first EL layer and the second EL layer are processed to each have an island-like top surface shape.

4. The manufacturing method of a display device, according to claim 1, further comprising after the ninth step:
    a tenth step of forming a common electrode over the first EL layer and the second EL layer; and
    an eleventh step of forming a protective layer over the common electrode.

5. The manufacturing method of a display device, according to claim 4, further comprising between the ninth step and the tenth step:
 a twelfth step of forming a common layer over the first EL layer and the second EL layer.

6. A manufacturing method of a display device, comprising:
 a first step of forming a first pixel electrode and a second pixel electrode each having a tapered shape;
 a second step of depositing an EL film over and in contact with a top surface and a side surface of each of the first pixel electrode and the second pixel electrode;
 a third step of forming a sacrificial film to cover the EL film;
 a fourth step of processing the sacrificial film and the EL film to form a first EL layer over the first pixel electrode, a first sacrificial layer over the first EL layer, a second EL layer over the second pixel electrode, and a second sacrificial layer over the second EL layer;
 a fifth step of removing the first sacrificial layer and the second sacrificial layer; and
 a sixth step of drying the first EL layer and the second EL layer,
 wherein in the fourth step, the EL film and the sacrificial film are processed by dry etching,
 wherein in the fifth step, the first sacrificial layer and the second sacrificial layer are removed by wet etching, and
 wherein the EL film includes a light-emitting layer that emits white light.

7. The manufacturing method of a display device, according to claim 6,
 wherein the sacrificial film contains a resin material soluble in water or alcohol,
 wherein in the fourth step, the sacrificial film and the EL film are processed in succession by dry etching in an atmosphere containing oxygen, and
 wherein in the fifth step, the first sacrificial layer and the second sacrificial layer are removed by being dissolved in water or alcohol.

8. The manufacturing method of a display device, according to claim 6,
 wherein the first EL layer and the second EL layer are processed to each have an island-like top surface shape.

9. The manufacturing method of a display device, according to claim 6, further comprising after the sixth step:
 a seventh step of forming a common electrode over the first EL layer and the second EL layer; and
 an eighth step of forming a protective layer over the common electrode.

10. The manufacturing method of a display device, according to claim 9, further comprising between the seventh step and the eighth step:
 a ninth step of forming a common layer over the first EL layer and the second EL layer.

* * * * *